(12) United States Patent
O-Tani

(10) Patent No.: US 11,669,541 B2
(45) Date of Patent: Jun. 6, 2023

(54) DATA INTERPRETATION APPARATUS, METHOD, AND PROGRAM, DATA INTEGRATION APPARATUS, METHOD, AND PROGRAM, AND DIGITAL CITY ESTABLISHING SYSTEM

(71) Applicant: RIKEN, Saitama (JP)

(72) Inventor: Hideyuki O-Tani, Saitama (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 17/631,095

(22) PCT Filed: Jul. 27, 2020

(86) PCT No.: PCT/JP2020/028751
§ 371 (c)(1),
(2) Date: Jan. 28, 2022

(87) PCT Pub. No.: WO2021/020356
PCT Pub. Date: Feb. 4, 2021

(65) Prior Publication Data
US 2022/0188326 A1 Jun. 16, 2022

(30) Foreign Application Priority Data
Jul. 29, 2019 (JP) .............................. JP2019-139150

(51) Int. Cl.
*G06F 16/25* (2019.01)
*G06F 16/901* (2019.01)

(52) U.S. Cl.
CPC ........ *G06F 16/258* (2019.01); *G06F 16/9024* (2019.01)

(58) Field of Classification Search
CPC ........................... G06F 16/258; G06F 16/9024
See application file for complete search history.

(56) References Cited

U.S. PATENT DOCUMENTS

| 5,278,946 A | 1/1994 | Shimada et al. |
| 5,524,202 A | 6/1996 | Yokohama |

(Continued)

FOREIGN PATENT DOCUMENTS

| CN | 109448794 | 3/2019 |
| JP | H04-030265 | 2/1992 |

(Continued)

OTHER PUBLICATIONS

Office Action dated Jul. 25, 2022 with respect to the corresponding Chinese patent application No. 202080054996.8.

(Continued)

*Primary Examiner* — Alex Gofman
*Assistant Examiner* — Umar Mian
(74) *Attorney, Agent, or Firm* — IPUSA, PLLC

(57) ABSTRACT

A data interpretation apparatus including a platform configured to automatically execute type conversion of an object. The platform is provided in a control unit of the data interpretation apparatus, and includes an obtaining unit and an interpretation unit. The obtaining unit obtains input data as the object of the platform. The interpretation unit generates an initial graph with respect to the object, and performs interpretation by automatically growing a graph from the initial graph while executing, as necessary, the type conversion of the object associated with each node of the graph toward extension or toward intension.

7 Claims, 31 Drawing Sheets

(56) References Cited

U.S. PATENT DOCUMENTS

| | | | |
|---|---|---|---|
| 5,970,490 A * | 10/1999 | Morgenstern | G06F 16/258 |
| 7,013,246 B1 | 3/2006 | Gerlovin et al. | |
| 2003/0120651 A1* | 6/2003 | Bernstein | G06F 16/258 |
| 2004/0034651 A1* | 2/2004 | Gupta | G06F 16/8358 |
| | | | 707/999.102 |
| 2004/0090472 A1* | 5/2004 | Risch | G06F 16/34 |
| | | | 707/E17.093 |
| 2007/0220022 A1 | 9/2007 | Lankinen et al. | |
| 2016/0188570 A1* | 6/2016 | Lobez Comeras | G06F 40/211 |
| | | | 704/9 |
| 2018/0239817 A1 | 8/2018 | Kepeklian | |

FOREIGN PATENT DOCUMENTS

| | | |
|---|---|---|
| JP | H04-275684 | 10/1992 |
| JP | H04-312142 | 11/1992 |
| JP | H06-149907 | 5/1994 |
| JP | H07-114464 | 5/1995 |
| JP | 2001-028016 | 1/2001 |
| JP | 2007-534068 | 11/2007 |
| JP | 2011-123644 | 6/2011 |
| JP | 2018-109977 | 7/2018 |
| WO | 2005/104028 | 11/2005 |

OTHER PUBLICATIONS

Ota et al., "Automatic Conversion of Mechanical Engineering Drawings to CAD Data", Journal of the Japan Society of Precision Engineering, vol. 60, No. 4, p. 524-529, 1994.

O-Tani et al., "A Template-Based Floor Shape Recognition Applied to 3D Building Shapes of GIS Data", Journal of Japan Society of Civil Engineers A1 (Structural Engineering & Earthquake Engineering), vol. 70, No. 4 (Journal of Earthquake Engineering, vol. 33), I_1124-I_1131, 2014.

Matsuyama, "Special feature, Chapter 2, Image Understanding", Journal of the Electrical Society, vol. 105, No. 5, pp. 409-411, 1985.

Sato, "For image recognition and understanding in the past and in the future", Information Processing, vol. 56, No. 7, pp. 628-633, Jul. 2015.

O-Tani et al., "Automatic Combination of the 3D Shapes and the Attributes of Buildings in Different GIS Data", Journal of Japan Society of Civil Engineers A2 (Applied Mechanics), vol. 70, No. 2 (Journal of Applied Mechanics, vol. 17), I_631-I_639, 2014.

International Search Report of Int. Appl. No. PCT/JP2020/028751 dated Sep. 24, 2020.

Dominiguez B et al: "Semiautomatic detection of floor topology from CAD architectural drawings", Computer-Aided Design, Elsevier Publishers BV., Barking, GB, vol. 44, No. 5, Dec. 29, 2011 (Dec. 29, 2011), pp. 367-378, XP028463008, ISSN: 0010-4485, DOI: 10.1016/J.CAD.2011.12.009 [retrieved on Jan. 3, 2012].

Lim Joie et al: "Automated Generation of BIM Models From 2D CAD Drawings", Proceedings of the 23rd International Conference of the Association for Computer-Aided Architectural Design Research in Asia (CAADRIA), Jan. 1, 2018 (Jan. 1, 2018), pp. 61-70, XP055817166, Retrieved from the Internet: URL:http://papers.cumincad.org/data/works/att/caadria2018_268.pdf [retrieved on Jun. 23, 2021].

Extended European Search Report dated Nov. 21, 2022 with respect to the corresponding European patent application No. 20847785.1.

Office Action dated Oct. 7, 2022 with respect to the Singaporean patent application No. 11202200867T.

"C# Upcasting and Downcasting" from BeginCodingNow.com, Aug. 4, 2018, retrieved from <http://web.archive.org/web/20221005025459/https://begincodingnow.com/cupcasting-and-downcasting/>.

* cited by examiner

FIG.5

| NAME OF CONSTRUCTION | CONSTRUCTION OF | | |
|---|---|---|---|
| DRAWING NAME | PIER STRUCTURE GENERAL DRAWING | | |
| SCALE | INDICATED IN DRAWING | DRAWING NUMBER | |
| DESIGN DATE | MONTH: | YEAR: | |
| XXX REGIONAL DEVELOPMENT BUREAU YYY OFFICE | | | |

FIG.8B

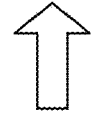

Table

| NAME OF CONSTRUCTION | CONSTRUCTION OF |  |  |
|---|---|---|---|
| DRAWING NAME | PIER STRUCTURE GENERAL DRAWING | | |
| SCALE | INDICATED IN DRAWING | DRAWING NUMBER | |
| DESIGN DATE | MONTH: | YEAR: | |
| XXX REGIONAL DEVELOPMENT BUREAU YYY OFFICE | | | |

ANALYZE AND CLASSIFY

TITLE BLOCK

| NAME OF CONSTRUCTION | CONSTRUCTION OF |  |  |
|---|---|---|---|
| DRAWING NAME | PIER STRUCTURE GENERAL DRAWING | | |
| SCALE | INDICATED IN DRAWING | DRAWING NUMBER | |
| DESIGN DATE | MONTH: | YEAR: | |
| XXX REGIONAL DEVELOPMENT BUREAU YYY OFFICE | | | |

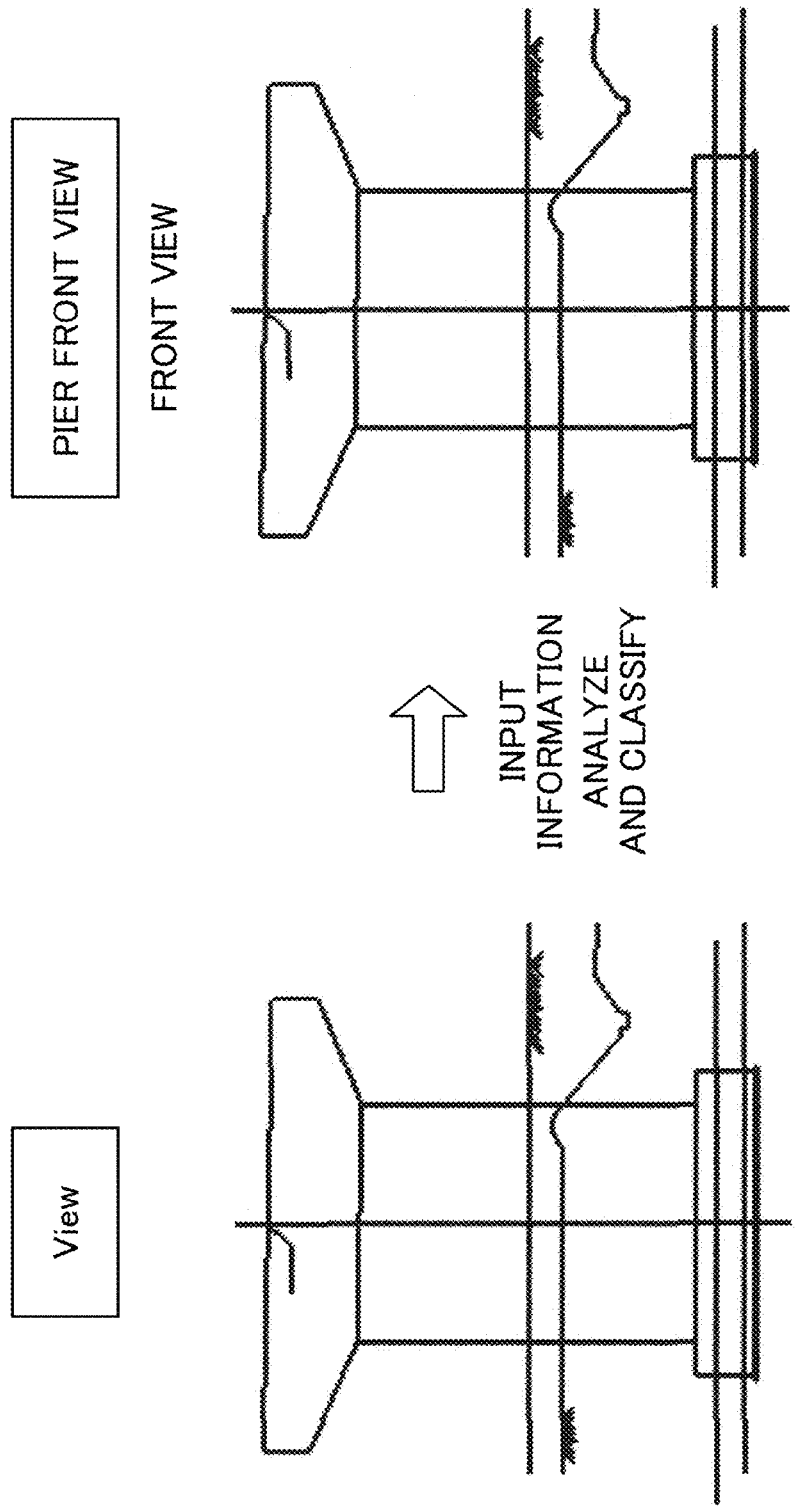

(1)

| SUBSTRUCTURE COORDINATES | | |
|---|---|---|
| | X | Y |
| ① | -97387.2 | 47546.4 |
| ② | -97388.4 | 47545.1 |
| ③ | -97388.4 | 47538.5 |

2D CAD DRAWING (2) FIRST ATTENTION IS FOCUSED ON LINES ⇒

(3) CLASSIFIED AS SET OF CELLS ⇑

RECOGNIZED CELL

⇐ INPUT CONTENTS OF CELLS FROM DRAWING (4)

| SUBSTRUCTURE COORDINATES | | |
|---|---|---|
| | X | Y |
| ① | -97387.2 | 47546.4 |
| ② | -97388.4 | 47545.1 |
| ③ | -97388.4 | 47538.5 |

FIG.16
(1) "INPUT INFORMATION"
CellSet +  2D CAD DRAWING
→ Table
| | X | Y |
|---|---|---|
| ① | −97387.2 | 47546.4 |
| ② | −97388.4 | 47545.1 |
| ③ | −97388.4 | 47538.5 |
(2) "ANALYSIS AND INTERPRETATION"
Table 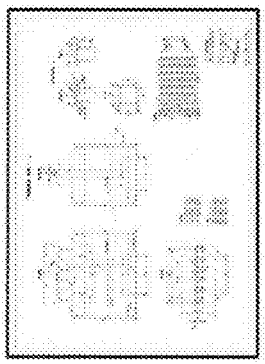
TITLE BLOCK
| NAME OF CONSTRUCTION | CONSTRUCTION OF |  |  |
|---|---|---|---|
| DRAWING NAME | PIER STRUCTURE GENERAL DRAWING | | |
| SCALE | INDICATED IN DRAWING | DRAWING NUMBER | |
| DESIGN DATE | MONTH: | | YEAR: |
| XXX REGIONAL DEVELOPMENT BUREAU | | | |
| YYY OFFICE | | | |
STRUCTURE HEIGHT TABLE 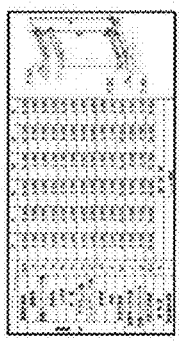
COORDINATES Table
| | X | Y |
|---|---|---|
| ① | −97387.2 | 47546.4 |
| ② | −97388.4 | 47545.1 |
| ③ | −97388.4 | 47538.5 |

FIG.19
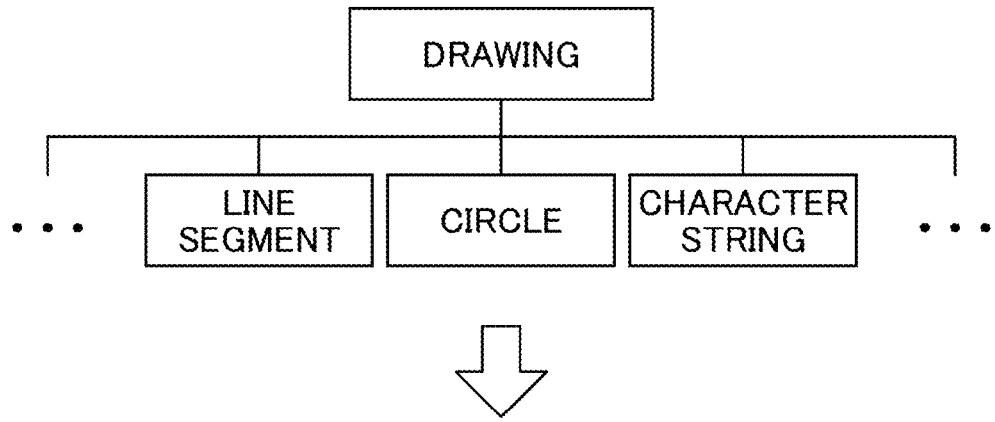
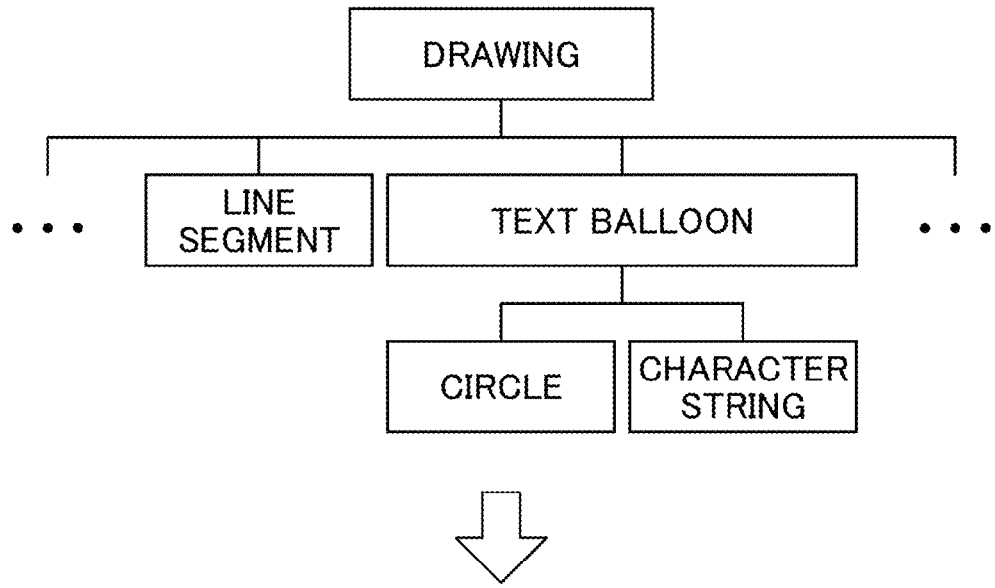
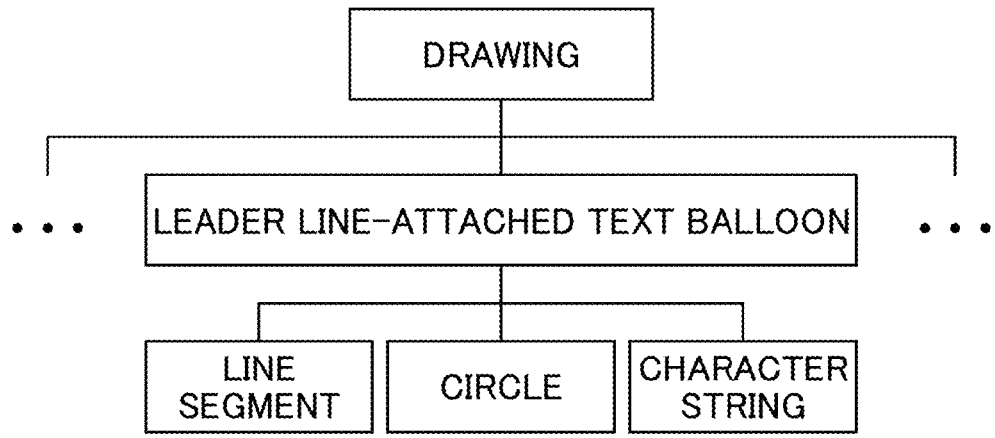

FIG.21
(1) 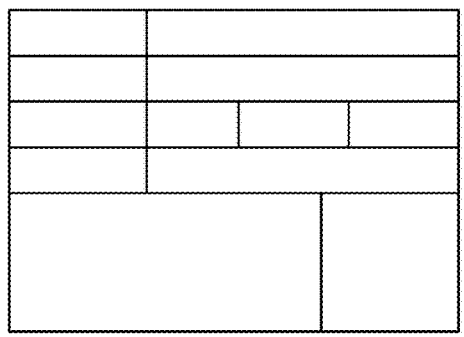 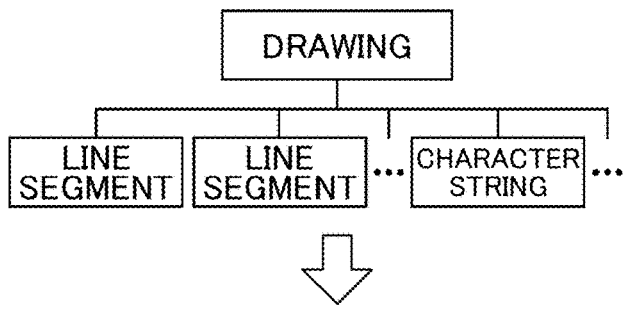
(2) 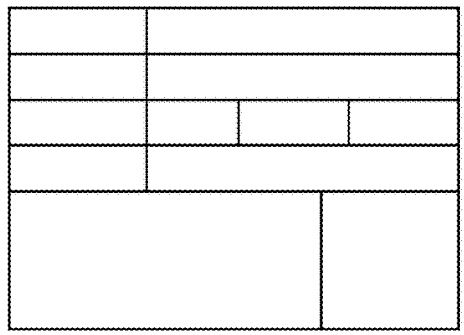 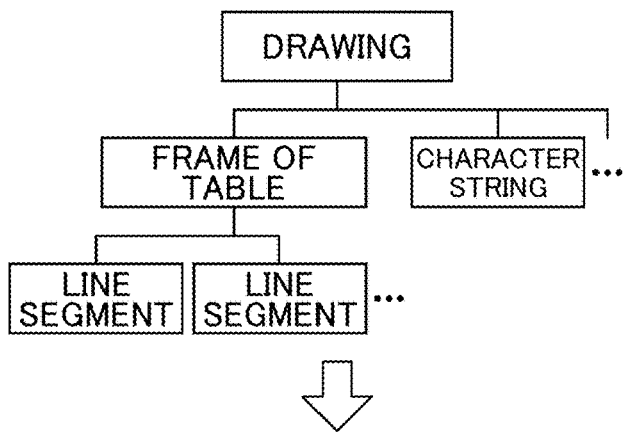
(3) 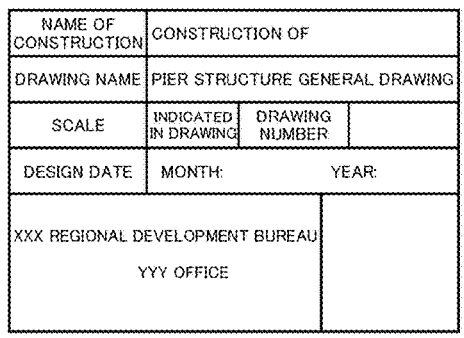 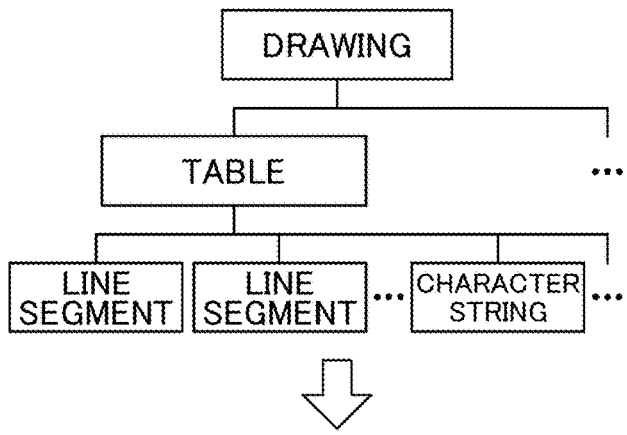
(4) 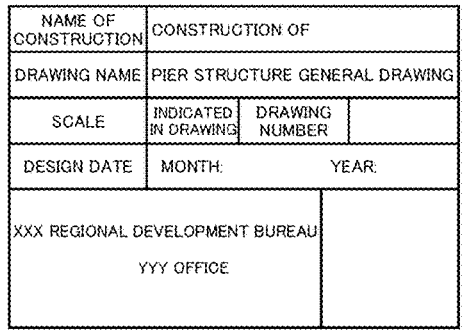 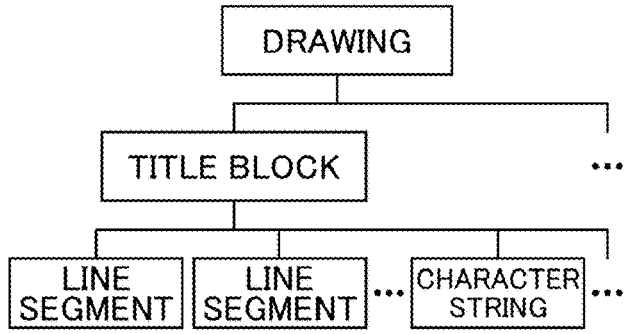

INDIVIDUAL DEVELOPMENT $F(X_1, Y_1)$
$F(X_1, Y_2)$
$F(X_1, Y_3)$
...
$F(X_2, Y_1)$
$F(X_2, Y_2)$
...
$F(X_i, Y_j)$
...

USE OF STANDARD FORMAT $F(X_1, Y_1)$

USE OF AUTOMATIC CONVERSION

STAR-SHAPED NETWORK IN WHICH STANDARD
EXPRESSION FORMAT IS IN THE CENTER

FREE NETWORK BASED ON AUTOMATIC CONVERSION OF
EXPRESSION FORMATS

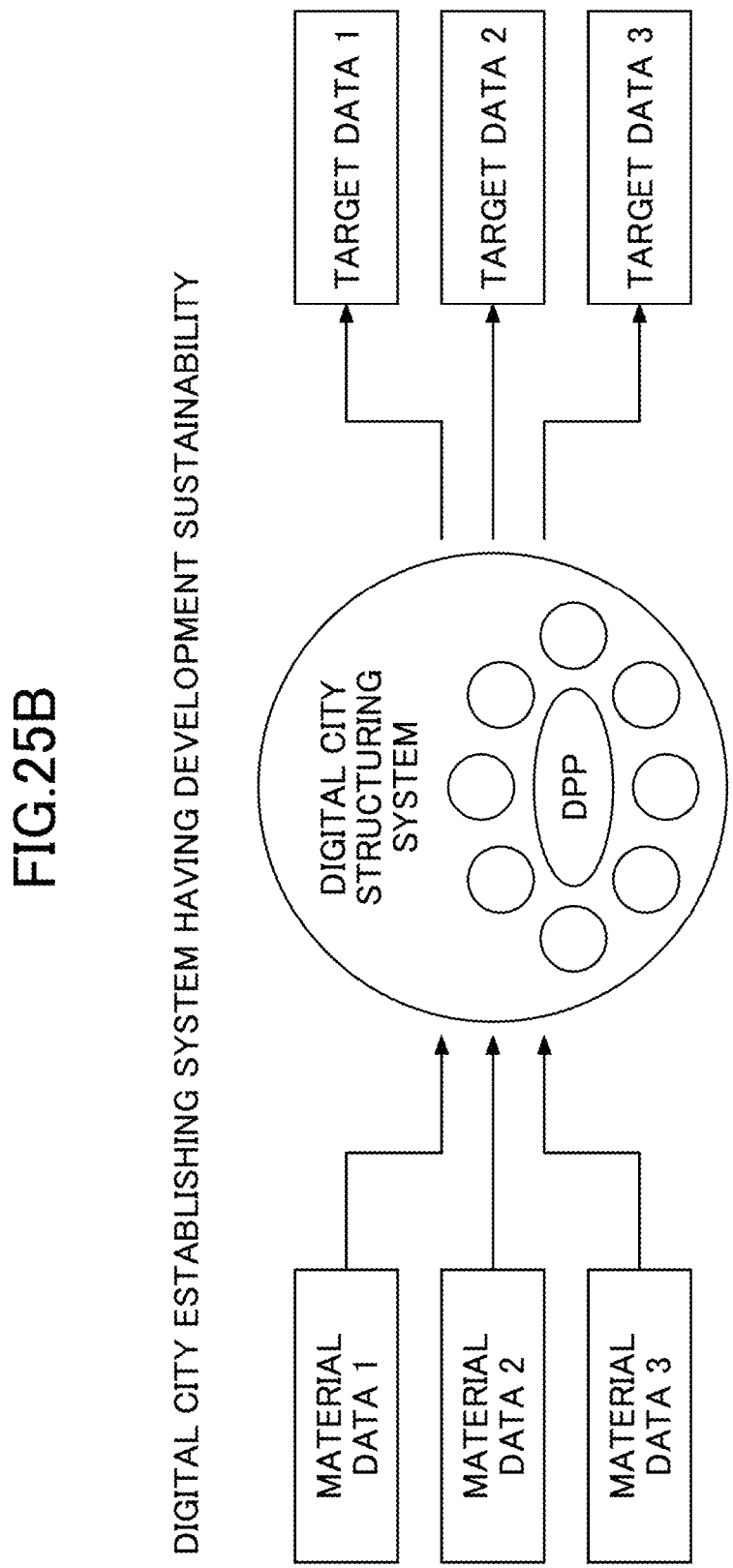

FIG.27

```
//
//Load library
//
library("DXF");
library("Interpreted");

//
//Read DXF file (obtained as object of DXF class)
//
data = DXF("006_P2 pier structure general drawing.dxf");
//
//Convert from DXF to ED_FeatureSet (intermediate data of DPP data type)
//Generate ED_FeatureSet_Interpreted (data of ED_FeatureSet in DPP data type attached with analyzed result)
//ED_FeatureSet_Interpreted can be treated as a type of ED_FeatureSet by automatic data conversion technique
//Being able to be treated as a type of ED_FeatureSet means that functions for visualization and the like defined in ED_FeatureSet are usable without any modification.
//
data = MakeInterpret(data);

//
//Output VTK file
//
//data$PierSideView [0] : Pier side view included in "006_P2 pier structure general drawing.dxf"
//data$PierSideView indicates a portion "PierSideView" of ED_FeatureSet_Interpreted
//Multiple pier side view may be included in the same design drawing, and [0] indicates the first one.
//data$PierPlanView [0] : Pier plan view included in "006_P2 pier structure general drawing.dxf"
//data$PierFrontView [0] : Pier front view included in "006_P2 pier structure general drawing.dxf"
//
if( data$PierSideView [0] != NA ) OutputVTK( data$PierSideView [0], output_path="tmp1.vtk");
if( data$PierPlanView [0] != NA ) OutputVTK( data$PierPlanView [0], output_path="tmp2.vtk");
if( data$PierFrontView [0] != NA ) OutputVTK( data$PierFrontView [0], output_path="tmp3.vtk");

return;
```

DATA INTERPRETATION APPARATUS, METHOD, AND PROGRAM, DATA INTEGRATION APPARATUS, METHOD, AND PROGRAM, AND DIGITAL CITY ESTABLISHING SYSTEM

TECHNICAL FIELD

The present invention relates to: a data interpretation apparatus, method, and program; a data integration apparatus, method, and program; and a digital city establishing system.

BACKGROUND ART

In order to achieve, at a realistic cost, a high degree of integration between cyberspace and a physical space that is assumed by the "Society 5.0" proposed in the Science and Technology Basic Plan, it is essential to not only carry out new attempts with respect to new buildings but also make use of documents such as an enormous number of design drawings and the like accumulated with respect to old infrastructure buildings. However, old documents are basically expressed to be seen and interpreted by humans by eye, and therefore, enormous costs are required for application to wide-area and high-resolution simulations.

Since the 1980s, many studies have been done to automatically establish 3D models from design drawings (NPL 1), but because these studies relied on techniques of assembling elements (lines and characters) of drawings from the bottom up, failure of interpretation of a portion may spread throughout the entirety to result in a collapse of three-dimensionalization, and there was such a difficulty that it cannot deal with complicated drawings.

In recent years, a technique for importing drawings into a CAD system and semi-automatically making them three-dimensional has become the mainstream. However, the use of this technique requires an engineer to have knowledge in not only CAD systems but also design drawings, and nonetheless requires enormous costs to render 3-D buildings in the CAD system.

CITATION LIST

Patent Literature

PTL 1: Japanese Laid-Open Patent Publication No. 2011-123644
PTL 2: Japanese Laid-Open Patent Publication No. H04-2315142
PTL 3: Japanese Laid-Open Patent Publication No. H04-030265
PTL 4: Japanese Laid-Open Patent Publication No. H04-275684
PTL 5: Japanese Laid-Open Patent Publication No. 2018-109977

Non-Patent Literature

NPL 1: "Automatic Recognition System of Mechanical Engineering Drawings", Journal of the Japan Society of Precision Engineering, Vol. 60, No. 4, p 524-529, 1994
NPL 2: "Development of Floor Shape Interpretation Method for Robust Automatic Structuring of Seismic Response Analysis Model", Journal of Japan Society of Civil Engineers A1 (Structural Engineering & Earthquake Engineering), Vol. 70, No. 4 (Journal of Earthquake Engineering, Vol. 33), I_1124-I_1131, 2014
NPL 3: "Special feature article, Second Chapter, Image Understanding", Journal of the Electrical Society, Vol. 105, No. 5, Pages 409-411, 1985
NPL 4: "Recognition and Understanding of Images and Videos until Today and in the Future", Information Processing, Vol. 56, No. 7, Pages 628-633, July, 2015
NPL 5: "Automatic Combination of the 3D Shapes and the Attributes of Buildings in Different GIS Data", Journal of Japan Society of Civil Engineers A2 (Applied Mechanics), Vol. 70, No. 2 (Journal of Applied Mechanics, Vol. 17), I_631-I_639, 2014

SUMMARY OF THE INVENTION

Technical Problem

Although techniques for automatically interpreting design drawings and automatically establishing three-dimensional models have been developed for a long time, it has been difficult to extract complete information, and the versatile and robust automatic generation of three-dimensional models has not been put into practical use. There is a need for a versatile methodology that allows a three-dimensional model to be established flexibly and robustly even for results obtained by automatically interpreting incomplete drawings. Furthermore, the three-dimensional models are desired to be usable for various purposes such as, for example, high-resolution numerical simulations.

Data that is basically expressed to be seen and interpreted by humans by eye and that cannot be extracted by a computer as such is referred to as "non-structured data". For example, 2D-CAD drawings are non-structured data, and are constituted by elements such as lines, curves, string characters, and the like, but a meaning such as a "figure" or a "table" expressed by a group of elements is not always explicitly described, and humans see them by eye and interpret that they are a "figure" or a "table" to read information. The non-structured data includes not only 2D-CAD drawings but also images including pixels as elements and point cloud data including points as elements. Also, even data that is not referred to as non-structured data in general may be deemed as non-structured data in a case where necessary information cannot be directly extracted. There is a need for a technique for reading fragmentary information by automatically interpreting the meaning of non-structured data on the basis of data of elements and a relationship (including a relationship in position) between the elements.

A figure or a table contained in a 2D-CAD drawing represents fragmentary information about an object (for example, a building) in a physical space to be expressed by the 2D-CAD drawing, and is neither an object as such to be expressed by the 2D-CAD drawing (i.e., an object in the physical space) nor a model of the object to be expressed. In this case, the "model" refers to a corresponding object in the virtual space to be expressed. The "fragmentary information" refers to information that is not necessarily sufficient for generating a representation-target model, and that may be integrated with other information to generate the representation-target model. In order to generate a model of an object (for example, a building) at a low cost, it is desired to make use of multiple pieces of different types of data ranging from new data to old documents (a type of data) generated according to individual purposes, and it is necessary to achieve a technique to generate the representation-target model by integrating fragmentary information distributed across multiple pieces of data.

Highly reusable programs are required in order to continuously advance the technology for making use of data in response to rapid increase of data called data explosion and exponential improvement in the computer performance that has been continuing for decades. However, in general, individually developed programs read and write data in unique formats optimized for individual purposes, and accordingly, data conversion programs equal in number to the number of combinations of the programs are basically required for coordination across the programs. This means that the cost of reuse is significantly low, and it is not feasible to continuously advance the technology with simple measures. It is common to deal with this problem by defining a standard expression format, but if the expression format is defined uniformly and fixedly, data providers and data users would be restricted from improving the data format on their own. In addition, the technology would be inflexible because all the programs depend on the fixed expression format.

In order to continuously advance the technology for making use of data, the present invention provides a method of loose coupling that enables the use of both of data expressed in a format defined as the standard and data in unique formats optimized for individual purposes. Furthermore, provided is a data interpretation apparatus, a method, and a program for extracting information from a wide range of data from new data to old documents. Furthermore, provided is a data integration apparatus, a method, and a program for generating a representation-target model of data by integrating fragmentary information distributed across multiple pieces of data. Furthermore, a digital city platform is provided.

Means for Solving the Problems

The present disclosure presents, as an example of a means for solving the problems described above, a technique for robustly and automatically interpreting two-dimensional design drawings, in addition to flexibly and automatically establishing a three-dimensional model in the degree of detail that differs according to the precision of interpretation results.

The present application discloses a drawing interpretation method that not only assembles elements of a drawing from the bottom up but also automatically identifies the context of figures to estimate the meanings applicable to the figures from the top down and complement information from the drawing according to the meanings. Specifically, this is achieved by automatically growing (automatic structuration) a tree structure, in which elements of the drawing are associated with nodes where a relationship between the entirety and a portion is a parent-and-child relationship.

This method is a robust technique in which, even if an interpretation fails, only a tree structure does not grow, i.e., only the precision of the interpretation does not improve, so that the entirety does not collapse. In this research, the automatic structuration technique is also employed for automatic generation of a three-dimensional model. Accordingly, the three-dimensional model in the degree of detail that differs according to the precision of interpretation of drawings can be flexibly, automatically established. In the three-dimensional model automatically established according to the technique of this research, information is organized based on relationships between the entirety and portions, and not only the shapes but also a wide variety of information ranging from internal structures of buildings to physical properties can be held, and therefore, the three-dimensional model is expected to be applied to various purposes.

Also, in the present invention, an interpreter capable of object-oriented programming for executing automatic type conversions, based on an extension-and-intension relationship between objects, is established, and a more detailed extension-side object is generated from an intension-side object (downcast) as necessary during interpretation of data and integration of data. The technique according to the present invention can perform downcasting that cannot be appropriately executed in conventional object-oriented programming due to lack of information.

Specifically, the present invention is as follows.

[1] A data interpretation apparatus comprising a platform configured to automatically execute type conversion of an object, wherein the platform is provided in a control unit of the data interpretation apparatus, and includes an obtaining unit and an interpretation unit, and the control unit functions such that: the obtaining unit obtains input data as the object of the platform; and the interpretation unit generates an initial graph with respect to the object, and performs interpretation by automatically growing a graph from the initial graph while executing, as necessary, the type conversion of the object associated with each node of the graph toward extension or toward intension.

[2] The data interpretation apparatus according to [1], wherein the interpretation unit automatically grows the graph by executing downcasting of the object that is a type conversion to the extension-side, based on an extension-and-intension relationship between objects, and adding, to the graph, a node associated with an object that has been downcast.

[3] A data interpretation method using a platform configured to automatically execute type conversion of an object, wherein the platform is provided in a control unit of a computer, and includes an obtaining unit and an interpretation unit, and wherein the obtaining unit executes a step of obtaining input data as the object of the platform; and the interpretation unit executes a step of generating an initial graph with respect to the object, and performing interpretation by automatically growing a graph from the initial graph while executing, as necessary, the type conversion of the object associated with each node of the graph toward extension or toward intension.

[4] A program configured to be executed by a computer, wherein in a platform configured to automatically execute type conversion of an object, the platform being provided in a control unit of the computer, and including an obtaining unit and an interpretation unit, the program causes the control unit to operate such that: the obtaining unit executes a step of obtaining input data as the object of the platform; and the interpretation unit executes a step of generating an initial graph with respect to the object, and performing interpretation by automatically growing a graph from the initial graph while executing, as necessary, the type conversion of the object associated with each node of the graph toward extension or toward intension.

[5] A data integration apparatus comprising a platform configured to automatically execute type conversion of an object, wherein the platform is provided in a control unit, and includes an obtaining unit and an interpretation unit, and the control unit functions such that: the obtaining unit obtains input data as the object of the platform; and the interpretation unit generates an initial graph with respect to the object, performs interpretation by automatically growing a graph from the initial graph while executing, as necessary, the type conversion of the object associated with each node of the graph toward extension or toward intension, and establishes integrated data obtained by integrating one or more objects.

[6] A data integration method using a platform configured to automatically execute type conversion of an object, wherein the platform is provided in a control unit of a computer, and includes an obtaining unit and an interpretation unit, and wherein the obtaining unit executes a step of obtaining input data as the object of the platform; and the interpretation unit executes a step of generating an initial graph with respect to the object, performing interpretation by automatically growing a graph from the initial graph while executing, as necessary, the type conversion of the object associated with each node of the graph toward extension or toward intension, and establishing integrated data obtained by integrating one or more objects.

[7] A program configured to be executed by a computer, wherein in a platform configured to automatically execute type conversion of an object, the platform being provided in a control unit of the computer, and including an obtaining unit and an interpretation unit, the program causes the control unit to operate such that: the obtaining unit executes a step of obtaining input data as the object of the platform; and the interpretation unit executes a step of generating an initial graph with respect to the object, performing interpretation by automatically growing a graph from the initial graph while executing, as necessary, the type conversion of the object associated with each node of the graph toward extension or toward intension, and establishing integrated data obtained by integrating one or more objects.

[8] A digital city establishing platform configured to perform automatic conversion of an expression format of data, wherein a plurality of programs each including a predetermined program element and including an input and an output of any given expression format are loosely coupled via data by the automatic conversion of the expression format, and a representation target of integrated data is a city or a building.

Advantageous Effects of Invention

The present invention can achieve a data processing platform that is an interpreter capable of expanding an application range of programs by automatically converting an expression format of data on the basis of the meaning of the data and is thus capable of improving the reusability of the programs. The data processing platform is capable of simultaneously using both of data expressed in a format defined as the standard and data in unique formats optimized for individual purposes, and is thus capable of continuously advancing the technology by accumulating the programs for making use of data. In addition, a data interpretation apparatus, method, and program for extracting information from a wide range of data from new data to old documents can be achieved using the data processing platform. Furthermore, a data integration apparatus, method and program for generating a representation-target model of data by integrating fragmentary information distributed across multiple pieces of data can be achieved using the data processing platform.

BRIEF DESCRIPTION OF THE DRAWINGS

FIG. 5 is a drawing illustrating-a "title block" of the pier structure general drawing.

FIG. 8B is a drawing indicating that an analysis and classification is performed to determine whether an item of "title block" exists in the object of the class "Table", and if the item of "title block" is determined to exist, the object is interpreted as an object of the class "title block".

FIG. 11 is a drawing indicating that, with respect to the object of the class "View", a character string indicating a title extracted from the CAD data is input, and an object having an item unique to the "pier front view" is interpreted as an object of which the class name is a "pier front view".

FIG. 16 is a drawing indicating that, in the present embodiment, mainly two ways, i.e., (1) "input of information" and (2) "analysis and interpretation", are set as recognition techniques of 2D-CAD drawings.

FIG. 19 is a drawing illustrating an example of growth of a tree structure in the drawing interpretation.

FIG. 21 is a drawing illustrating a recognition process of a title block.

FIG. 25B is a drawing illustrating an aspect of a digital city establishing system having a development sustainability.

FIG. 27 is an example of a script for interpreting a 2D-CAD drawing "006_P2pier structure general drawing.dxf".

MODES FOR CARRYING OUT THE INVENTION

Figure 1:
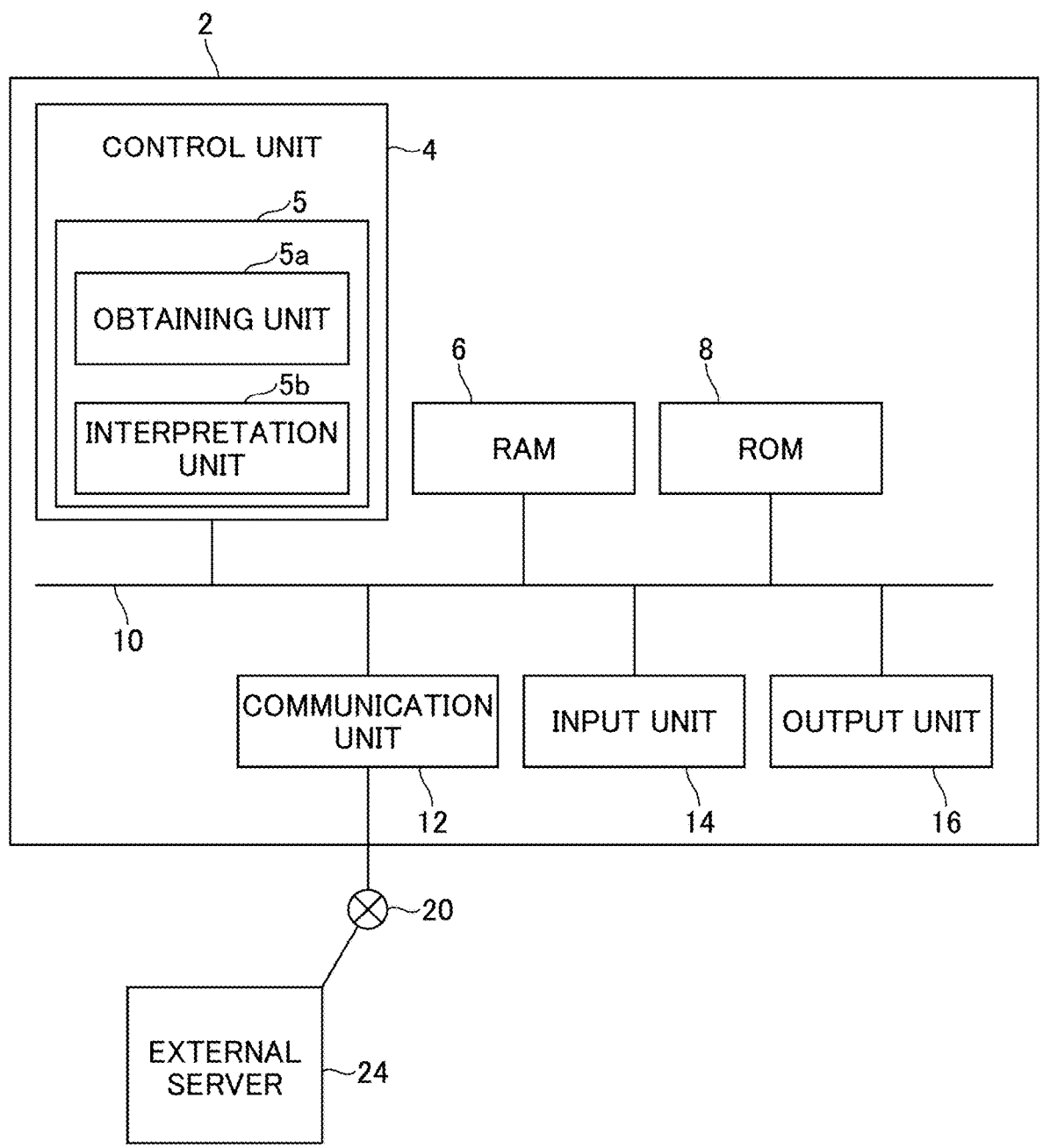
FIG. 1 is a drawing illustrating a physical configuration of a data interpretation apparatus according to a first embodiment.

Hereinafter, embodiments are described in detail with reference to drawings as necessary. However, detailed explanation that is more than necessary may be omitted. For example, detailed explanation about already well-known matters and duplicate explanation about substantially the same configuration may be omitted. This is to avoid making the following explanation unnecessarily redundant and to facilitate the understanding of those skilled in the art.

It should be noted that the inventor provides the attached drawings and the following description so that those skilled in the art fully understand the present disclosure. The description and drawings are not intended to limit the subject matter described in the claims.

1. Research of Data Processing Platform

First, the data processing platform (DPP) is explained in the sections of "1.1. Purpose and content of research", "1.2. Meaning and importance of automatic conversion of expression format of data", "1.3. Definition of logical equivalence of data", "1.4. Requirement and implementation of DPP", and "1.5. Developed theory and conclusion with regard to implementation" (these sections are hereinafter referred to as "Disclosure of this research and conception"). The data processing platform relates to research conducted by the present inventor, and functions as an interpreter for establishing a digital city.

1.1. Purpose and Content of Research 1.1.1. Need of Digital City

Attempts to quantify the damage caused by earthquakes and tsunamis to a city have progressed to interdisciplinary research, such as evaluation of the impact on transportation and the economy. It is expected that the resulting programs are used together with high-performance computers and are usefully used for comprehensive disaster prevention. However, even if there are computers and programs, they cannot be applied to an actual city without a digital city to simulate a disaster.

1.1.2. Requirement of Digital City

What should the digital city be? At least, the digital city must allow information necessary for quantifying the damage to be freely extracted. Under the circumstances where "data explosion" and "exponential improvement in the computer performance" occur, the digital city should not be in a fixed manner that quickly becomes obsolete, and the digital city should be something that flexibly supports new data and new programs and can continuously evolve.

1.1.3. Difficulty in Generation of Digital City: Heterogeneity

The problem to be solved with generation of the digital city is not only to freely enable the extraction of information from a wide variety of data but also to make it possible to continuously develop the digital city. However, these objectives are not easily achieved. This is because, conventionally, although a scheme for standardizing and unifying the expression format of data is employed in order to freely extract information, the expression format is in a fixed manner. Also, under the current circumstances, data is recorded in the optimum expression format according to the purpose at the time of creation, and accordingly, the expression formats of extant data are not unified.

1.1.4. Establishing of Digital City, Conventional Technique, and Expected Difficulty Even so, the digital city can be established upon conducting necessary standardization for the immediate purpose. However, this method is inefficient because it requires a digital city and a program for establishing the digital city to be developed from scratch every time the purpose changes, and it is expected that when the complexity of a digital city increases to such a level that it cannot withstand redevelopment, the development of digital city establishing technology reaches a plateau.

1.1.5. Purpose

Originally, unlike a standardized shape of a machine part, the expression format of data can be changed flexibly as long as the meaning and the content of the data are the same, and even if a program assumes a particular expression format as an input, it can be applied to data expressed in a different format if a mechanism for automatically changing the expression format is provided. For example, in a case where a program for calculating a distance between two points on a two-dimensional plane expressed by the cartesian coordinate system receives a point expressed by another coordinate system such as the polar coordinate system, any given program can be commonly used with multiple expression formats by performing automatic conversion of the coordinate system. If this mechanism can be universally achieved, an information extraction program that is not dependent upon expression formats can be readily generated, and also, data and programs can be readily replaced.

In the "Disclosure of this research and conception", it is proposed to make an interpreter (which is referred to as a data processing platform (DPP)) having a mechanism to automatically convert expression formats and to accumulate, as its library, program elements for establishing a digital city. The "platform" means one that functions as a basis for collecting and linking program elements. Also, with respect to the "data processing platform (DPP)" disclosed in this specification, the term "platform" means that the DPP functions as a basis for collecting and linking program elements.

In a system including the DPP and its library, new data and new programs can be retrieved by simply adding or replacing a program, and the advancement of the system corresponds to the advancement of the digital city. In addition, in order to achieve this system, it is an object of the "Disclosure of this research and conception" to define logical equivalence of data in different expression formats and present an automatic conversion method of expression formats according to the definition.

1.1.6. Content

The content of the "Disclosure of this research and conception" is summarized as follows. The meaning and importance of automatic conversion of expression formats of data in generation of a digital city are emphasized in "1.2.", and a theory for the conversion, and in particular, logical equivalence of data is explained in "1.3.". Then, an implementation corresponding to the theory is explained in "1.4.". In "1.5.", the developed theory and conclusion with regard to implementation are explained.

1.2. Meaning and Importance of Automatic Conversion of Expression Formats of Data 1.2.1. Purpose of this Section In this section "1.2.", diversity in expression formats of data, which serves as materials for the digital city, and problems to be solved during use that is caused by the diversity are explained. In addition, it is explained that, by automatically converting expression formats of data based on the meaning of data, the application range of a program that is conventionally limited by the expression formats of data is expanded, and the reusability of programs is improved. Furthermore, it is explained that, with this improvement in the reusability, a system for automatically establishing a digital city can be achieved as a loosely coupled system that can flexibly add or change program elements.

1.2.2. Diversity in Expression Formats of Data and Problems to be Solved During Use 1.2.2.1. Contrivance in Expression Formats in Respective Fields Data that serves as materials for the digital city is usually data that is individually generated for certain particular purposes, and the expression formats thereof are contrived according to their purposes and methods of uses.

For example, in general, data is shared in a format that is defined by a standardization organization, and is often data in a human-readable text format, but in high-performance computing, binary formats are usually employed, and data of the same type are often arranged in a row in order to read and write the entirety at a high speed. In searching of data that is saved for a long period of time, a portion is often accessed, and a data structure based on a collection of the meaning and the content of the search target can be selected. Even for data that has equivalent meaning and content, a wide variety of expression formats are defined and used by the subject of calculation and the subject of management of data in accordance with a wide variety of processing purposes.

1.2.2.2. Difficulty in Generation of Digital City

1: Combination Explosion in Program Development (FIG. 23A)

The generation and the use of a digital city can be deemed as a systematic application of a process for inputting multiple pieces of data and outputting target data, and each of the processes is characterized by the input data and the output data. In general, even for processes that have equivalent meaning and content, if the expression formats of data are different, it is necessary to implement a different program, and there is a risk in that the wide range of expression formats can significantly reduce the efficiency of the development. For example, even for a simple process of outputting the distance between two objects, implementation is required for each combination of input expression formats of data as in FIG. 23A, and a combination explosion easily occurs.

Figures 23A, 23B:
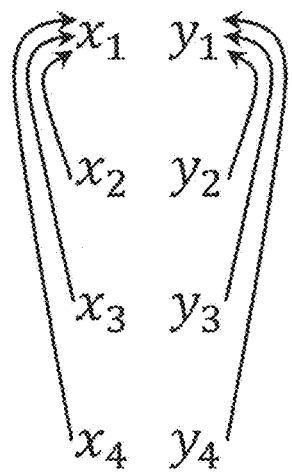
FIG. 23A is a drawing illustrating an implementation method of data processing in a case of individual development.
FIG. 23B is a drawing illustrating an implementation method of data processing in a case where a standard format is used.
Figure 23C:
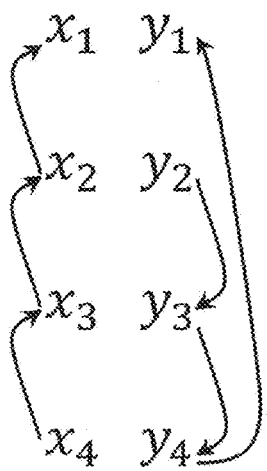
FIG. 23C is a drawing illustrating an implementation method of data processing in a case where automatic conversion is used.

FIG. 23A to FIG. 23C are drawings illustrating three types of implementation methods of data processing. An arrow indicates conversion of expression formats of data. FIG. 23A illustrates a case of individual development. FIG. 23B illustrates a case where a standard format is used. FIG. 23C illustrates a case where an automatic conversion is used. In FIG. 23A to FIG. 23C, $F(X_i, Y_j)$ represents a function that performs predetermined data processing by receiving data $x_i$ in an expression format $X_i$ and data $y_j$ in an expression format $Y_j$. When $i \ne i'$, the expression formats of $X_i$ and $X_{i'}$ are different from each other. Likewise, when $j \ne j'$, the expression formats of $Y_j$ and $Y_{j'}$ are different from each other.

1.2.2.3. Difficulty in Generation of Digital City

2: Problems Associated with Standard Format

If, as illustrated in FIG. 23B, the expression formats of data to be used are unified, and a processing program is implemented only for the standard expression format, it is considered that similar implementations can be prevented from being repeated. However, this methodology inhibits designing and using expression formats that are suitable for purposes, and is therefore not feasible especially in the field of high-performance computing. This is because, in many cases, programs developed in the field of high-performance computing receive an input of data in an expression format that is uniquely designed by a developer for the purpose of improving the computing performance. Although it is, needless to say, useful to define a standard expression format by a standardization organization, a new methodology for linking data and programs that can handle a wide variety of expression formats of data is needed in order to apply, to digital cities, numerical simulations that are achieved by applying high-performance programs developed in the field of high-performance computing.

1.2.3. Reuse of Processing Programs by Automatic Data Conversion 1.2.3.1. Reuse of Processing Programs by Automatic Conversion (Including Path Finding)

As illustrated in FIG. 23C, the application range of a program is expanded by automatically converting expression formats of data on the basis of the meaning of the data, so that the reusability of programs can be improved. Normally, the application range of a program depends on expression formats of data, but if conversion path for maintaining the meaning and the content of data is defined between expression formats in advance, and a function for automatically performing path finding for tracking this conversion path is implemented, then, the application range of a program is expanded in such a manner as to be dependent on the meaning and the content. Also, it can be considered that it is possible to select and execute an optimum processing program from among the implementations of multiple processing programs by appropriately defining a method of path finding.

1.2.3.2. Relativization of Intermediate Data and Standard.

Figure 24A:
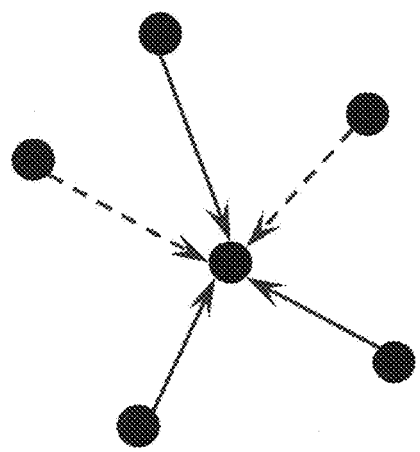
FIG. 24A is a drawing illustrating, as an example of a topology of the network constituted by expression formats and conversion paths, a star-shaped network in which a standard expression format is in the center.
Figure 24B:
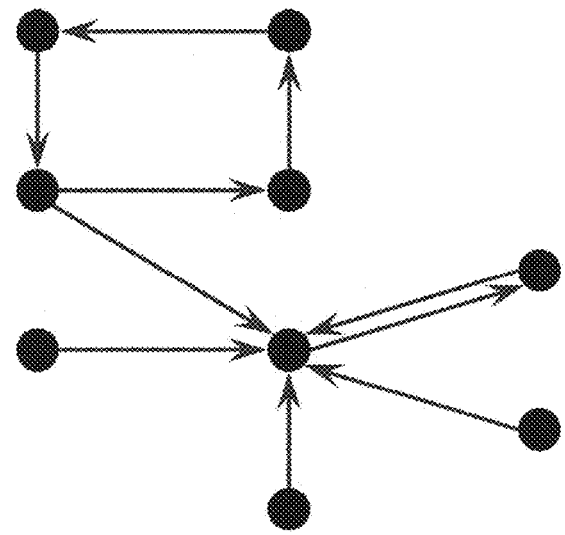
FIG. 24B is a drawing illustrating, as an example of a topology of the network constituted by expression formats and conversion paths, a free network based on automatic conversion of expression formats.

As illustrated in FIG. 24, a network in which an expression format is denoted as a node and a conversion path is denoted as a link can be considered. In this case, FIG. 24 illustrates a topology of the network constituted by expression formats and conversion paths. FIG. 24A illustrates a star-shaped network in which a standard expression format is in the center. FIG. 24B illustrates a free network based on automatic conversion of expression formats.

As illustrated in FIG. 24A, the methodology based on the standard expression format limits the topology of the network to the star shape in which the standard expression format is in the center, and the standard expression format serves as an intermediate data format for mediating data and programs. In contrast, in the methodology based on the automatic conversion of expression formats, the topology configuration of the network is free, and the position where data and the program are connected is also free (see FIG. 24B). Even data that is not directly connected to the program is indirectly, automatically connected by the automatic conversion, and therefore, data and the program can be readily replaced. In addition, this network can be grown by adding new expression formats and processing programs. As a result of growth of the network, a star-shaped topology may be constituted, but unlike the standard expression format defined in a form of top down, the expression format located in the center is a de-facto standard expression that is naturally determined in a form of bottom up.

1.2.3.3. Reduction of Burdens on Users of Data

In recent years, a considerable amount of open data that is useful as materials for the digital city is published and shared by way of clearinghouses. However, the open expression formats of data are diverse, and when the developer of an application program combines multiple pieces of data, in many cases, it is necessary to start by understanding the expression format of each piece of data, and developing a program for extracting information from the data. If there is a system that achieves a methodology based on automatic conversion of expression formats, and an information extraction program can be shared, then, the open data and an already developed processing program are automatically connected, which facilitates the development of the application program. In this system, data can be handled without the system needing to be aware of non-essential details of data, i.e., the implementation specific to a particular expression format, so that the learning burdens of users of data are also reduced.

1.2.3.4. Improvement of Reusability with Wrap of Processing Program

The automatic conversion of expression formats hides the details of implementations of data, while an application programming interface (API), i.e., another mechanism for enhancing the reusability of programs, hides the details of implementations of programs. Provision of city information by way of a Web API corresponds to the sharing of the information extraction program explained above, and is expected to reduce the cost of development of application programs. Various information about cities has already been provided as Web APIs, which are expected to increase in the future, but this situation is similar to a situation where useful data in unique formats increases. The functions of the application programs having the APIs are also characterized by the expression formats of data for inputs and outputs, and therefore, the automatic conversion of the expression formats is applicable. In this case, the input data expresses an instruction to the API.

1.2.4. Digital City Establishing System 1.2.4.1. Definition of Digital Cities

The lifespans of buildings, which are constituent elements of a city, are long, while the progress in the research and development is rapid. Therefore, it is expected to accumulate data generated in the stages of design, construction, and maintenance, and use the accumulated data for various purposes by applying a technique developed later. In fact, an enormous amount of data is stored for extant buildings, and the effective use of that data is being promoted. For example, damage estimation of earthquakes and tsunamis using numerical value simulation is one such example. In order to carry out numerical value simulation, a model of a city in an appropriate degree of detail is needed to be expressed on a computer, and the model is established by extracting fragmented information about the city from multiple pieces of data and integrating the information into data that approximates knowledge about the constituent elements of the real city. In the "Disclosure of this research and conception", the model of the city serving as this integrated knowledge is defined as a digital city. The digital city is used as an information source for creating target data, such as input data for numerical value simulation.

1.2.4.2. Digital City Based on Standard Format

Figure 25A:
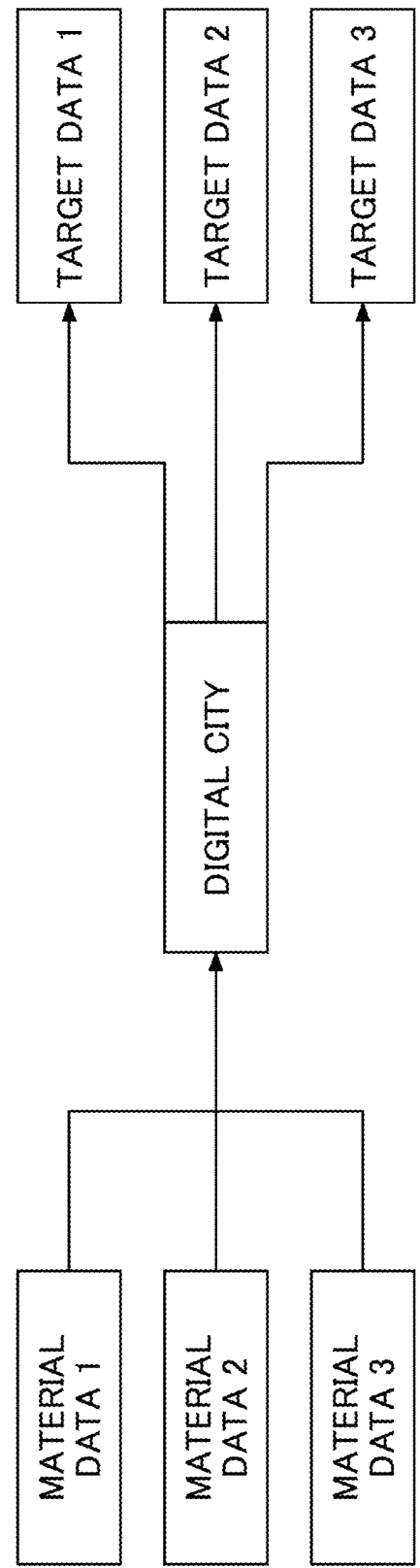
FIG. 25A is a drawing illustrating an aspect of a digital city fixed by a standard format.

As illustrated in FIG. 25A, a simple form of construction and use of the digital city includes defining a standard format capable of expressing all of the constituent elements of the city, generating data expressed in that format from data serving as materials, applying an implemented program to the data in the standard format, and thus generating target data. However, the methodology of linking data and programs, on which this form is based on, is unable to handle a wide variety of actual expression formats as described above. In addition, because all the programs depend on the standard format, it takes a considerable amount of effort to change the standard format. The task of manually converting data from an extant old standard format into a new standard format is also enormous. As a result, the expression of the city in numerical values is fixed, which inhibits the advancement of technology.

1.2.4.3. Digital City Establishing System

In the "Disclosure of this research and conception", as a form of construction and use of a digital city, it is proposed to develop a digital city establishing system for accumulating program elements for establishing the digital city on the basis of the DPP that is a uniquely created interpreter having a mechanism of automatically converting expression formats as illustrated in FIG. 25B, and to adopt the data of the materials for the digital city and the target data as an input and an output, respectively, therefor. In this system, programs are connected via data, and the connection between data and programs depends on the meaning and the content, instead of depending on the expression formats of data. This means that, as long as the meaning and the content are the same, the connection can be flexibly changed without depending on a difference in the expression format. In order to advance the digital city establishing technology, it is extremely important to employ, from an early stage, a design for avoiding redundant development and preventing the technology from reaching a plateau by using a loosely coupled system capable of flexibly adding and changing program elements.

1.3. Definition of Logical Equivalence of Data

When two pieces of data expressed in different formats are equivalent to each other, this means that correct replacement for replacing any given data with another piece of data expressed in a different format can be performed mutually. If there is no clear definition as to a condition in which two pieces of data can be correctly replaced, the meaning and the content that is different from the original may be extracted from the replaced data. In this section "1.3.", logical equivalence of data that differs in the expression format is defined using predicate logic, so that logically correct replacement can be performed at all times.

1.3.1. Extension-and-Intension Relationship Between Data Expressions

In order to define logical equivalence between data expressions, which serves as a basis for automatically converting expression formats of data, a predicate logic L1 in which a set of the entirety of data expressions is a domain of discourse D1 is considered. In this case, each expression format of data corresponds to a 1-place predicate of L1, and a subset of D1 in which the values of the 1-place predicates of the expression formats are true is the entirety of data expressions that can be expressed by the expression formats. It is defined that when two data expressions are logically equivalent, a 2-place predicate "=" of L1 that expresses an extension-and-intension relationship between the data expressions, which are elements of D1, is satisfied. Note that a term "hyponymy" may be used in place of the term "extension", a term "hypernymy" may be used in place of the term "intension", and a term "relationship between hypernymy and hyponymy" may be used in place of the term "extension-and-intension relationship".

A 2-place predicate "⇒" is defined as follows based on the assumption that the reflexive and transitive laws are satisfied. Note that "→" is a logic symbol.

$$\forall x(x \Rightarrow x)$$

$$\forall x \forall y \forall z((x \Rightarrow y) \&\& (y \Rightarrow z) \rightarrow (x \Rightarrow z))$$

Hereinafter, when x⇒y is satisfied, then this is expressed as "x has y as an intension" or "y has x as an extension". Also, a 2-place predicate "⇔" is defined as follows.

$$\forall x \forall y((x \Leftrightarrow y) \leftarrow \rightarrow ((x \Rightarrow y) \&\& (y \Rightarrow x)))$$

It is defined that when x⇔y is satisfied, x and y are equivalent.

An n-place function φ and an n-place predicate ψ of L1 are referred to as being regular, if the following two conditions are satisfied.

$$\forall x \forall y((x \Rightarrow y) \rightarrow (\varphi(\ldots, x, \ldots) \Rightarrow \varphi(\ldots, y, \ldots))) \quad \text{(Expression 1)}$$

$$\forall x \forall y((x \Rightarrow y) \rightarrow (\psi(\ldots, y, \ldots) \rightarrow \psi(\ldots, x, \ldots))) \quad \text{(Expression 2)}$$

For example, where x and y are data expressions of a log house and a house, respectively, and Roof (a) is a regular 1-place function that associates a data expression of a roof of "a" with "a", then, (x⇒y)→(Roof (x)⇒Roof (y)) is satisfied according to the first expression. This means that "if a log house is a house, then, a roof of the log house is a roof of the house". Also, where HasRoof (a) is a regular 1-place predicate indicating an attribute that "'a' has a roof", then, (x⇒y)→(HasRoof (y)→HasRoof (x)) is satisfied according to the second expression. This means that "if a log house is a house, and if the house has a roof, then, the log house also has a roof".

An identity function is a regular function, and a predicate that always returns true and a predicate that always returns false are regular predicates. In general, with respect to the extension-and-intension relationship between data expressions, simply by imposing satisfaction of the reflexive law and the transitive law, it cannot be determined which function and predicate are a regular function and a regular predicate, and it cannot be determined whether two data expressions are in an extension-and-intension relationship. In the "Disclosure of this research and conception", in view of the situations in which only basic regular functions and regular predicates are defined first and thereafter regular functions and regular predicates are successively defined, it is defined that, when the Expression 1 and the Expression 2 are satisfied with respect to any given regular function and regular predicate that have already been defined, then, the two data expressions are in an extension-and-intension relationship. This means that a meaning is given to a subject according to the definition of the regular function and the regular predicate. It is an object of the disclosure according to this research to discard a non-essential difference between expression formats, and the extension-and-intension relationship between data expressions is determined by defining a function and a predicate, of which values can be determined without relying on expression formats, as a regular function and a regular predicate.

For example, an expression format Cartesian2D that expresses a point on a two-dimensional plane with the cartesian coordinate system and an expression format Polar2D that expresses a point on a two-dimensional plane with the polar coordinate system are considered. The data expression of Cartesian2D is a set (x, y) that includes an x coordinate and a y coordinate, and the data expression of Polar2D is a set (r, θ) that includes a radius r and angle θ. With respect to a position of a point on the two-dimensional plane, an x coordinate and a y coordinate can be measured in the given cartesian coordinate system, without relying on data expressions. For example, when the cartesian coordinate system and the polar coordinate system are associated such that x=r cos θ and y=r sine, the x coordinate and the y coordinate corresponding to a data expression (r, θ) of Polar2D can be measured from this relational expression. In this case, where the measurement of the x coordinate and the y coordinate is defined as a regular function for associating a data expression of a real-number expression format Real with a point on the two-dimensional plane, in a case where the data expression of Polar2D is an extension of the data expression of Cartesian2D, the measurement results of the x coordinate and the y coordinate in the two data expressions are equivalent, i.e., the two data expressions indicate the same point, according to the Expression 1.

As another example, an expression format Cartesian2D_RGB in which a colored point on the two-dimensional plane is expressed as a set (x, y, r, g, b) that includes an x coordinate, a y coordinate, and RGB values is considered. The measurement of the x coordinate and the y coordinate corresponding to a data expression of Cartesian2D_RGB is also possible. In a manner similar to the above example, in a case where the data expression of Cartesian2D_RGB is an extension of the data expression of Cartesian2D, the measurement result of the x coordinate and of the y coordinate in the two data expressions are equivalent, i.e., the two data expressions indicate the same point.

1.3.2. Extension-and-Intension Relationship Between Expression Formats

In the previous subsection "1.3.1.", the extension-and-intension relationship between data expressions is defined. In this subsection, a predicate logic L2 in which a set of the entirety of the 1-place predicate of L1 is a domain of discourse D2 is introduced, and the extension-and-intension relationship is reconsidered as a relationship between the 1-place predicate of L1.

This means that the extension-and-intension relationship between pieces of data is understood as a relationship between symbols where a 1-place predicate name is a label and each data expression is an instruction target, and enables the property of data and the expression method of data to be handled separately. Specifically, when certain information is recorded as data, the property of data can be discussed in L2 in advance, and thereafter, a specific expression method of the data can be determined so that the property expressed with L2 is attained.

It is defined that, when 1-place predicates A and B of L1 are in an extension-and-intension relationship in L2, A and B satisfy the following relational expression in L1.

$$\forall x(A(x) \rightarrow \exists y(B(y) \&\& (x \Rightarrow y))) \quad \text{(Expression 3)}$$

From this expression, it can be said that, in L2 in a manner similar to L1, the reflexive law and the transitive law are satisfied with respect to the extension-and-intension relationship. Also, when two special 1-place predicates T and F of L1 satisfying conditions $\forall x\ (T(x))$ and $\forall x(\neg F(x))$ are considered, T has all the 1-place predicates as extensions, and F has all the 1-place predicates as intensions.

For each data expression of L1, a 1-place predicate of L1, of which the value is true only for that data expression, can be considered, and the 1-place predicate is an element of D2. In the "Disclosure of this research and conception", in order to simplify expressions, when the data expression of L1 is denoted as "a", an element of D2 corresponding to this data expression "a" is similarly referred to as "a". However, the data expression is denoted by lowercase letters so as to be distinguished from an expression format of data that is denoted by uppercase letters. When data expressions "a" and "b" are in a relationship of a⇒b in L1, a relationship of a⇒b is also satisfied in L2 according to the Expression 3. With respect to any given expression format "A" and its data expression "a", a⇒A is satisfied in L2 according to the Expression 3.

Under the definition of the Expression 3, the regular function and the regular predicate of L1 can be expanded as follows to the regular function and the regular predicate of L2. First, values of an n-place regular function $\varphi$ in L2 are 1-place predicates of L1, and a subset of D1 corresponding to the 1-place predicates is defined as a set of the entire values of the function $\varphi$ in L1 that are calculated with respect to a set of all the elements of L1 in which the arguments of the function $\varphi$ in L2, i.e., the 1-place predicates of L1, are true. It is defined that, when a value of the n-place regular predicate $\psi$ in L2 is true, the value of the corresponding predicate $\psi$ in L1 is true with respect to the set of any given elements of L1 in which the arguments of the predicates, i.e., the 1-place predicates of L1, are true. In this case, with respect to the regular function and the regular predicate of L1 that have been expanded, an Expression 4 and an Expression 5 corresponding to the Expression 1 and the Expression 2, respectively, in L1 are also satisfied in L2.

$$\forall A \forall B((A \Rightarrow B) \rightarrow (\varphi(\ldots,A,\ldots) \Rightarrow \varphi(\ldots,B,\ldots))) \quad \text{(Expression 4)}$$

$$\forall A \forall B((A \Rightarrow B) \rightarrow (\psi(\ldots,B,\ldots) \rightarrow \psi(\ldots,A,\ldots))) \quad \text{(Expression 5)}$$

A relationship between any given expression format and its data expression corresponds to a relationship between a class and an instance of object-oriented programming, and the extension-and-intension relationship corresponds to an inheritance relationship. From this perspective, an expression obtained by specializing the Expression 5 with respect to the 1-place predicate corresponds to the Liskov substitution principle of object-oriented programming. However, in the "Disclosure of this research and conception", a "class" and a "data type" (which may also be simply referred to as a "type") are assumed to be synonyms.

When an expression format expressing a truth value as data is defined, it is important to be able to define a predicate as a function. This indicates that data can be expressed with only a regular function without using a regular predicate. Also, many-valued logic can be expressed by a way as to how truth values are defined. Therefore, hereinafter, the discussion is focused on regular functions.

Where A⇒B holds in L2, at least one map B<A> from A to B that satisfies the following expression exists in L1.

$$\forall x(A(x) \rightarrow (B(B<A>(x)) \&\& (x \Rightarrow B<A>(x))))$$

This map B<A> is referred to as an automatic conversion map. When an automatic conversion map is implemented, expression formats of data can be automatically converted. The automatic conversion map and an element of D2 are considered to correspond to morphism and an object in the category theory, and a one-place regular function is considered to correspond to a covariant functor.

1.4. Requirement and Implementation of DPP

In this section "1.4.", "Requirement and implementation of DPP" is explained, and a method in which the DPP automatically converts (i.e., automatically executes type conversion of) expression formats of data as necessary for application to a previously registered processing program on the basis of extension-and-intension relationship between pieces of data defined in the previous section "1.3. Definition of logical equivalence of data" is explained.

1.4.1. Difference in Characteristics Between Data Processing Platform and Conventional Object-Oriented Programming Hereinafter, differences in characteristics between the data processing platform and conventional object-oriented programming are shown.

TABLE 1

| | Data Processing Platform | Conventional Object Programming |
|---|---|---|
| Definition of Inheritance Relationship | Being in extension-and-intension relationship is required. | Definition can be made even if extension-and-intension relationship is not satisfied. |
| | Definition can be made even if data structure is not shared. | It is required to share data structure. |
| Data abstraction | Between types in inheritance relationship, not only an expression obtained by expanding Liskov substitution principle (Expression 5) but also a unique expression (Expression 4) are always satisfied. | Between types in inheritance relationship, it is recommended to satisfy Liskov substitution principle in order to ensure the possibility of substitution. |
| Range of application of program | Expanded to a form specified by meaning and content. | Specified by expression format of input data. |
| Restriction on the number of user-defined type conversions | The number of execution of type conversion is not limited. Path of type conversion is automatically searched, and according to the searched result, automatic conversion is | The number of execution of type conversion is limited to once. |

TABLE 1-continued

| Data Processing Platform | Conventional Object Programming |
|---|---|
| executed automatically for the required number of times. | |

As shown in Table 1, the DPP according to the present disclosure is based on an idea different from conventional object-oriented programming. In conventional object-oriented programming, it is required to share a data structure in the definition of an inheritance relationship. In contrast, in the DPP, it is not required to share a data structure in the definition of an inheritance relationship. Instead, being in an extension-and-intension relationship is required as a condition for satisfying an inheritance relationship between classes.

In the DPP, the user can define an inheritance relationship between classes, without being restricted by the constraint of sharing the data structure. The number of executions of automatic (implicit) type conversion is not limited, and an optimum path for converting the type is automatically searched, and along the found path, the conversion is automatically executed for a required number of times. In the type conversion of the DPP, not only logically equivalent type conversion (referred to as same-value cast) but also both of type conversion to an extension side (referred to as downcast) and type conversion to an intension side (referred to as upcast) are automatically executed. However, a condition in which conversion to a conversion-destination type can be performed is defined for each object, and downcast is executed only when the definition is satisfied.

The present inventor has written, in C++, the DPP functioning as an interpreter. It is to be understood that a person skilled in the art can make a similar interpreter according to the description of this specification, and a data processing platform according to the present disclosure implemented with such an interpreter and an apparatus, a method, and a program having the platform are also included in the scope of the present invention.

The language for implementing the DPP is not limited to C++, and the DPP may be written in any given language so long as requirements equivalent to the requirements described in this specification are satisfied and an equivalent implementation is possible.

1.4.2. Requirement and Implementation

The digital city establishing system according to the "Disclosure of this research and conception" is made by accumulating an program element group for establishing a digital city on the basis of an interpreter (DPP) disclosed in the present invention having a mechanism of automatically converting expression formats, and generates target data by establishing the digital city from the data of source materials. To implement the DPP, the following three requirements are taken into consideration.

(Requirement 1) Having an interface through which processing instructions are given to the digital city establishing system.
(Requirement 2) Functioning as a wrapper for extant processing program.
(Requirement 3) Having the capability to accumulate processing programs as a library that can be developed individually.

As mentioned in the previous section "1.3.", the relationship between any given expression format and its data expression corresponds to a relationship between a class and an instance of object-oriented programming, and the extension-and-intension relationship corresponds to an inheritance relationship. According to this correspondence, the user of the digital city establishing system gives an instruction of processing to the DPP by using some kind of object-oriented language. Although the details of the implementation are described later, in the language interpreted by the DPP, unlike usual language, it is not necessary to share a data structure between classes in an inheritance relationship, and the data structure of each class can be freely designed. In addition, when a function is applied, path finding to track an inheritance relationship, and automatic conversion of the type are performed as necessary.

When an already developed program is incorporated into the DPP, it is inefficient to implement the functions of the old program with a new language again. The DPP is implemented so as to be able to wrap and use the classes and the functions of the C++ language with the classes and the functions of the DPP. Accordingly, the DPP can link already developed data and programs in a loosely coupled manner according to the methodology of the "Disclosure of this research and conception".

The DPP is implemented so that a definition of a class and a processing program associated with the class can be individually compiled into a dynamic library. The library is loaded as needed, and conversion path finding and automatic conversion are executed according to the inheritance relationship defined in the library.

The user of the DPP can freely expand the system by making unique expression formats and processing programs into libraries and loading the libraries.

1.4.3. Implementation of Automatic Conversion and Method for Applying Processing Programs An expression format can be converted by tracking, as a conversion path, an automatic conversion map defined across expression formats. Although conversion can be performed through a wide variety of paths, it should be noted that, in general, equivalent data expressions are not always obtained when certain data is converted through a different path. In order to make results obtained by converting data be equivalent regardless of the paths, the expression format of the conversion destination may satisfy the following condition in L1.

$$\forall x \forall y ((A(x) \,\&\&\, A(y)) \to (\exists k ((k \Rightarrow x) \,\&\&\, (k \to y)) \to (x \to y)))$$

An expression format that satisfies this condition is defined as granular. In a case where conversion is performed into a non-granular expression format, there is a possibility that loss of unnecessary information may occur depending on the definition of the automatic conversion map. With respect to materials data for the digital city, most of extant expression formats are granular, but it is considered that there are expression formats that are not granular. It is appropriate to implement the automatic conversion function of expression formats in the DPP in view of expression formats that are not granular and to implement classes of the DPP to be granular as a general rule.

The classes of the DPP are the subject of the predicate logic L2 defined in the previous section "1.3.", i.e., implementations of the 1-place predicates of L1, and may be expression formats of data, or may express simple attributes that do not have internal data. In this case, the "attributes" refer to the 1-place predicates of L1 that are not expression formats of data. The automatic conversion map from expression formats to attributes is assumed to be an identity map. The attributes are defined across a wide variety of expression formats, and thus are generally not granular. When a regular function that handles only an attribute and expresses the property as a concept of the attribute is appropriately implemented, the DPP is considered to be able to define an Ontology language.

Even if an extension-and-intension relationship is established between two expression formats, the automatic conversion of expression formats cannot be performed unless a conversion path connecting between the two expression formats is prepared. The DPP recognizes that the extension-and-intension relationship is established only in a case where the automatic conversion map is implemented, so that the user is not confused as to whether the automatic conversion is possible. At first glance, this is contrary to the theory that the extension-and-intension relationship is determined by the definition of a regular function and a regular predicate, but an inconvenience does not occur. When, in fact, a program developer clearly distinguishes between the definition in theory and the definition in the implementation, and when an extension-and-intension relationship is configured to be recognized in the implementation only in a case where an extension-and-intension relationship is established in theory, then, this can prevent falsely recognizing that there is an extension-and-intension relationship in the implementation even though there is not an extension-and-intension relationship in theory.

In a network in which an expression format is a node and an automatic conversion map is a link, the automatic conversion of expression formats is implemented so as to be able to find and execute a path with the minimum cost. As an example, the automatic conversion of expression formats is executed by, for example, a path with the minimum cost based on Dijkstra's algorithm, and in a case where the automatic conversion map is an identity map, the cost is deemed as zero, and in other cases, the cost is deemed as one, but the automatic conversion of expression formats is not limited thereto. In order to improve the efficiency of the path finding, nodes and links that do not lead to the target are removed in advance on the basis of the extension-and-intension relationship.

Figure 26:
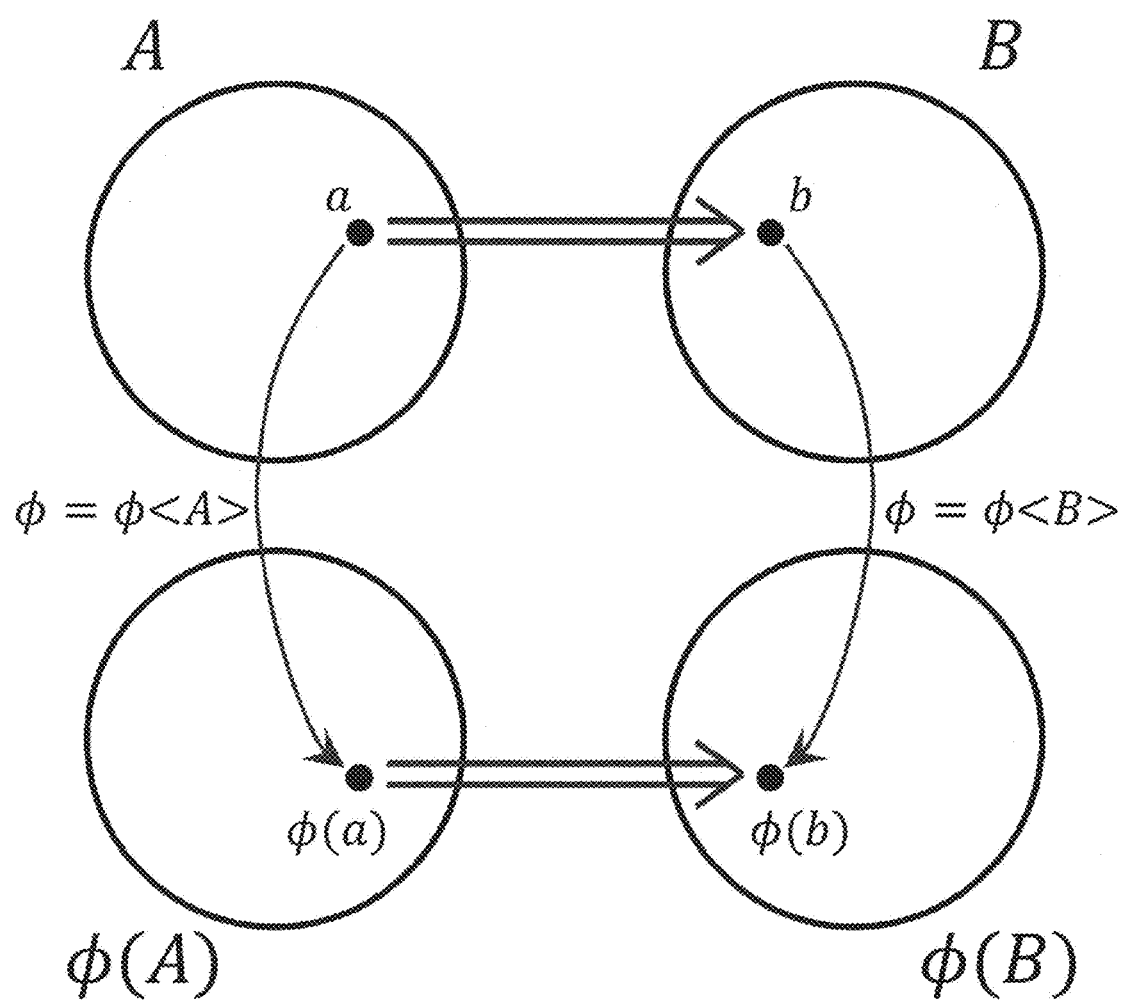
FIG. 26 is a drawing illustrating an example of automatic conversion of expression formats in a case of a 1-place function $\varphi$ of L1.

FIG. 26 illustrates an example of an automatic conversion of expression formats based on the Expression 4 in a case of a 1-place function $\varphi$ of L1. With $\varphi$, although a processing program can be implemented for each expression format of an input, when a regular function $\varphi<B>$ having B as a domain is implemented, an automatic conversion map $B<A>$ is defined if $A \Rightarrow B$ holds in the DPP, and accordingly, $\varphi<B>(B<A>(a))$ can be calculated for any given data expression a of A. This may be deemed such that, as a result of the automatic conversion of expression formats, the domain of $\varphi<B>$ has been expanded to include A. In contrast, when the function $\varphi<A>$ is implemented, $\varphi<A>(a) \Rightarrow \varphi<B>(B<A>(a))$ is derived from the Expression 4. Although $\varphi(a)$ can be calculated in two ways, it is more appropriate to apply a function and thereafter drop information as necessary, rather than dropping information by the automatic conversion and thereafter applying a function, and therefore, the DPP employs the latter calculation method in a case where $\varphi<A>$ is defined. This is also applicable to general n-place functions, and a selection method of the implemented function is similar to polymorphism of conventional object-oriented programming.

1.5. Developed Theory and Conclusion with Regard to Implementation

A condition in which two pieces of data expressed in different formats are equivalent is clearly defined, and an implementation is made based on the definition, so that the expression formats of the data have been successfully, automatically converted without causing logical errors. Element programs for establishing a digital city based on the DPP are accumulated, so that it is considered that the digital city establishing technology can be efficiently and continuously advanced.

In some cases, data in a new expression format obtained by expanding an old expression format can be converted to the old expression format under a particular condition, and an old program can be made use of. From the perspective of improving the reusability of programs, a flexible data conversion technique that determines the possibility of automatic conversion depending on the content of individual data is required. Accordingly, the DPP checks whether data expressed in any given format satisfies a particular condition, and in a case where it is satisfied, the DPP expands the application range of the function by executing the automatic conversion.

2. Purpose of Embodiments

Hereinafter, in order to continuously advance the technology for making use of data, it is an object of the present disclosure according to embodiments of the invention to provide a method of loose coupling allowing both of data expressed in a format defined as standard and data in unique formats optimized for individual purposes to be used at the same time. Specifically, it is an object of the present disclosure to provide a method for, instead of standardization of expressing data in a uniform format, achieving loose coupling by abstracting data based on automatic data conversion of expression formats to flexibly link different types of data and different types of program groups.

Furthermore, it is an object to provide a data interpretation method using such a method of loose coupling to extract information from a wide range of data from new data to old documents.

Still furthermore, it is an object of the present disclosure to provide a data integration method using such a method of loose coupling to generate a representation-target model of data by integrating fragmentary information distributed across multiple pieces of data.

3. Platform and Objects for Data Processing

In order to achieve the above object, the present inventor has conceived of the platform for data processing explained in "1. Research of data processing platform" and an object defined and established based on the platform. In the present disclosure, the platform (functioning as an interpreter) according to the conception of the inventor is referred to as the data processing platform (DPP). Also, an object defined and established based on the DPP is simply referred to as an object. The characteristics of the DPP and the object by the present inventor are hereinafter summarized and explained.

Figure 2A:
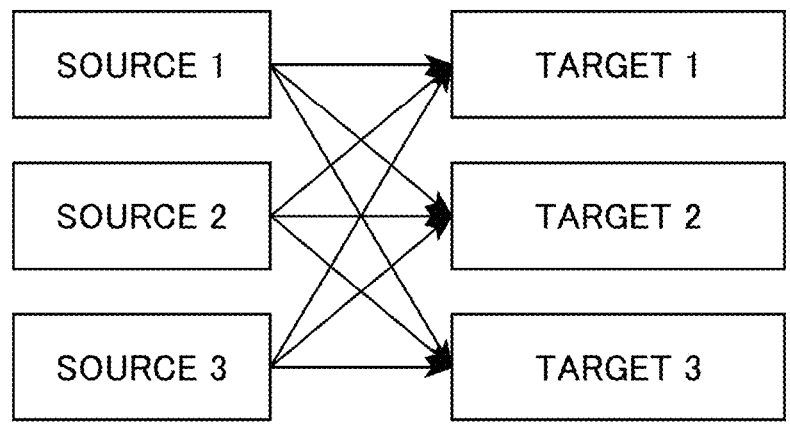
FIG. 2A is a drawing schematically illustrating conversion of data in expression formats of a "source 1", a "source 2", and a "source 3" into data in expression formats of a "target 1", a "target 2", and a "target 3".

In order to convert data in any given format into data in a format of another object, usually, a unique conversion program is required. For example, as illustrated in FIG. 2A, it is assumed that data in expression formats of a "source 1", a "source 2", a "source 3" . . . and a "source M" (specifically, data of M types of expression formats) is converted into data in expression formats of a "target 1", a "target 2", a "target 3" . . . and a "target N". In this case, conversion programs for M×N combinations (in FIG. 2A, specifically, 3×3=9 combinations) are required.

Figure 2B:
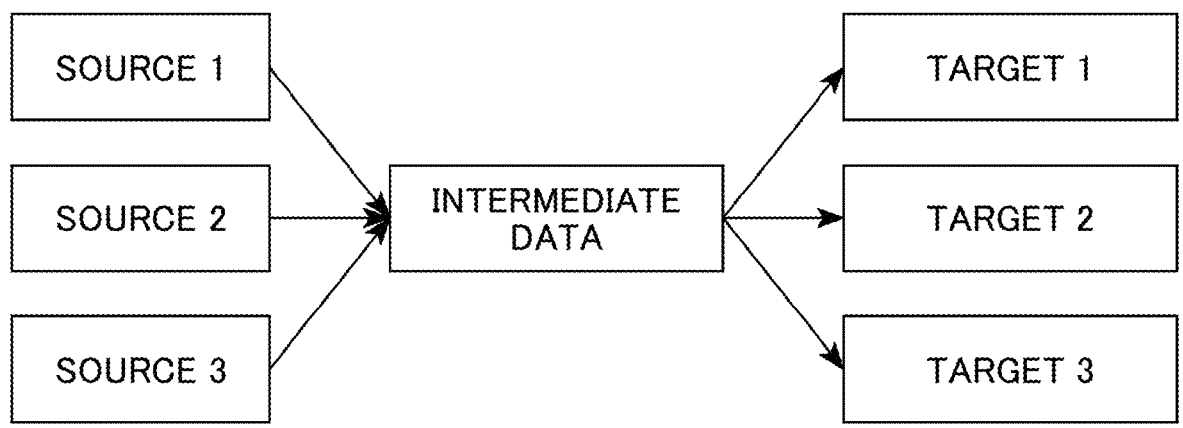
FIG. 2B is a drawing schematically illustrating setting of "intermediate data" as an intermediate of conversion from the "source 1", the "source 2", and the "source 3" to the "target 1", the "target 2", and the "target 3".

In this case, as illustrated in FIG. 2B, a setting of "intermediate data" is introduced. Specifically, "intermediate data" is set as an intermediate of conversion from the "source 1", the "source 2", the "source 3" ... the "source M" to the "target 1", the "target 2", the "target 3" ... the "target N". In this case, only M+N combinations (3+3=6 combinations in FIG. 2B) of conversion programs are required. Specifically, "M×N combinations" decrease to "M+N combinations".

However, with the "intermediate data" as illustrated in FIG. 2B, all the components (conversion programs and data) depend on the "intermediate data" as illustrated in FIG. 2B, and when there is a change in the "intermediate data" which is standardized data, M+N combinations of conversion programs are always required to be redeveloped.

Accordingly, the inventor of the present disclosure has conceived of the DPP for performing automatic data conversion as described above.

In the DPP, unlike objects of the conventional object-oriented programming, objects of which type conversions are automatically executed in optimum conversion paths have been introduced and defined. The inheritance relationship of the classes of the objects are defined according to the following (Condition 1) to (Condition 3).

(Condition 1) The inheritance relationship satisfies the reflexive law and the transitive law.

(Condition 2) An inheritance relationship between classes is recognized when an extension-and-intension relationship is satisfied. For example, a situation is assumed in which a first object belongs to a first class having (x, y) coordinates, a second object belongs to a second class having (r, θ) coordinates (polar coordinates), and the first class is a subclass of the first superclass. In a case where these classes are defined by C++, an inheritance relationship between the first superclass and the second class does not exist because of the principle that an inheritance relationship cannot be attained unless coordinate expressions are the same. In contrast, in a case where these classes are specified by the DPP defining the object, an inheritance relationship occurs when an extension-and-intension relationship is satisfied, and therefore, there is an inheritance relationship between the first superclass and the second class.

(Condition 3) A polymorphism based on an inheritance relationship between classes having different internal structures is achieved by executing automatic path finding for tracking conversion processing defined between classes and automatic data conversion.

The above-described "extension-and-intension relationship" corresponds to an "is-a relationship" of object-oriented programming. Also, in this case, satisfying of an extension-and-intension relationship is explained in the above-described "1.3. Definition of logical equivalence between data".

In the DPP, all the data is treated as objects.

Figure 3A:
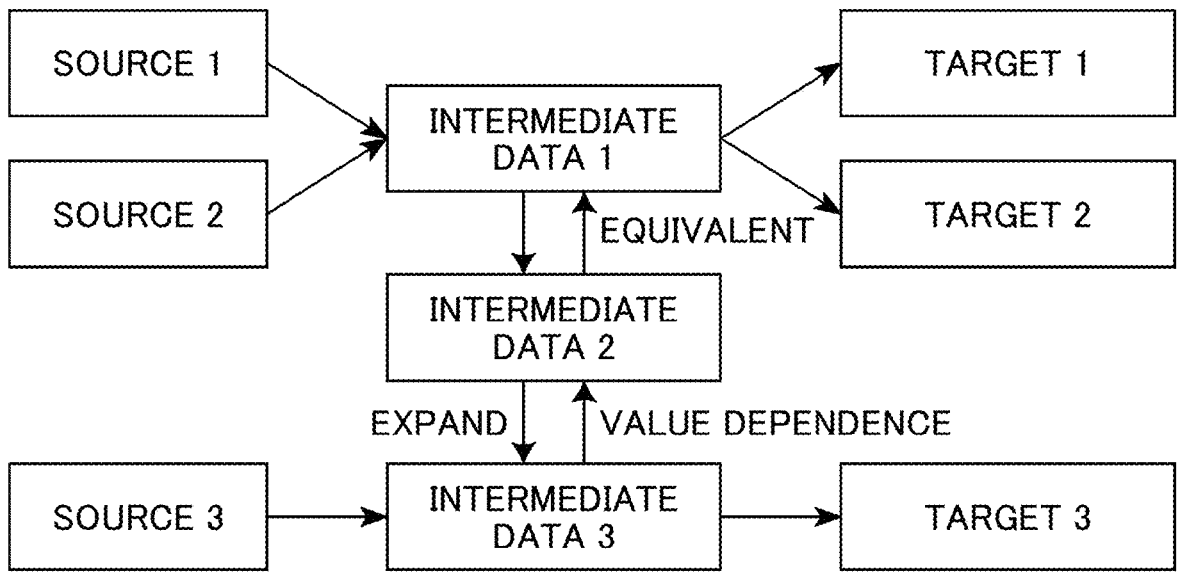
FIG. 3A is a drawing illustrating another situation of intermediate data by automatic data conversion.

FIG. 3A is a drawing illustrating intermediate data-based situations in automatic data conversion. Data in FIG. 3A, i.e., a "source 1", a "source 2", a "source 3", "intermediate data 1", "intermediate data 2", "intermediate data 3", a "target 1", a "target 2", and a "target 3" are all made into objects. The respective names are class names (type names).

In FIG. 3A, first, it is assumed that the "intermediate data 1" is set as an intermediate for conversion from the "source 1" and the "source 2" to the "target 1" and the "target 2", and the "intermediate data 3" is set as an intermediate for conversion from the "source 3" to the "target 3". Also, the class "intermediate data 2" is set between the "intermediate data 1" and the "intermediate data 3". In this case, for example, conversions from the "source 1" and the "source 2" to the "target 3" can be newly achieved via the "intermediate data 1", the "intermediate data 2", and the "intermediate data 3". Likewise, conversions from the "source 3" to the "target 1" and the "target 2" can be newly achieved via the "intermediate data 3", the "intermediate data 2", and the "intermediate data 1".

In this case, a relationship between the "intermediate data 1" and the "intermediate data 2" is an equivalent relationship. The "intermediate data 3" is obtained by expanding the "intermediate data 2". In order to carry out change and expansion of intermediate data in such a state that old components are available, two combinations of conversions may be considered between the "intermediate data 1" and the "intermediate data 2", and two combinations of conversions may be considered between the "intermediate data 2" and the "intermediate data 3". This means that the efficiency is improved from redevelopment of M+N combinations to development of two combinations of conversions.

In the DPP of the present disclosure, respective classes are defined so that arrows between pieces of data, i.e., classes (for example, arrows that are between the source 1 and the target 1 and that extend from the source 1 to the target 1), indicate an inheritance relationship. In a case of the source 1 and the target 1, the "source 1" is a subclass, and the "target 1" is a superclass, as indicated by arrows.

Figure 3B:
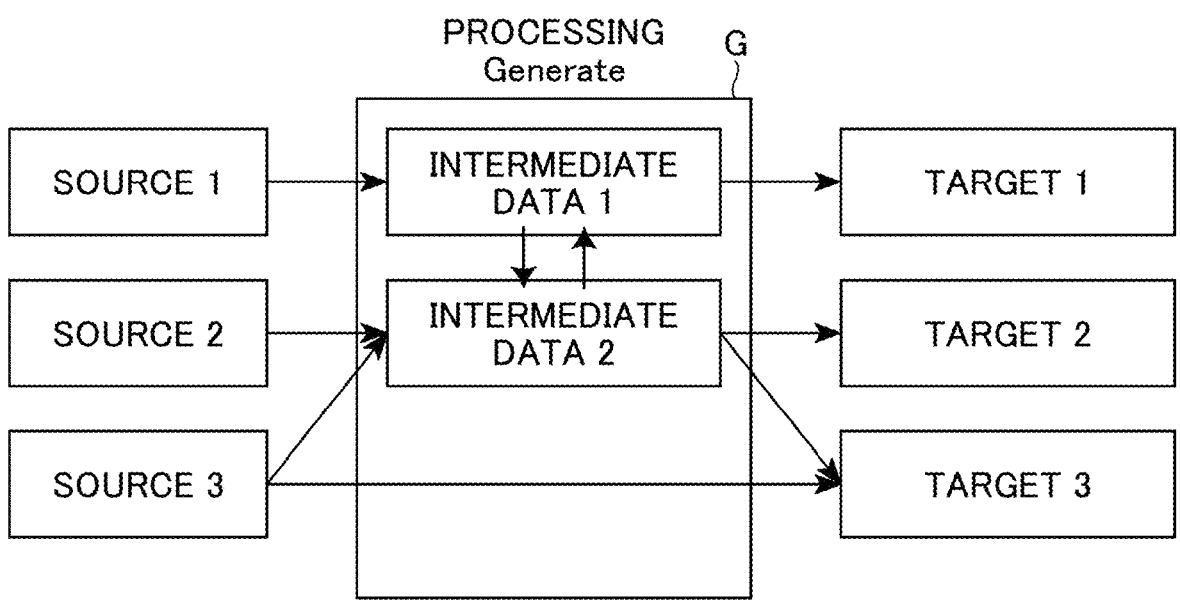
FIG. 3B is a drawing illustrating an example of data automatic conversion of an interpreter according to the present invention.

Further, in the DPP, an interpreter for automatic data conversion can be established. FIG. 3B is a drawing illustrating an operation example of an interpreter. First, it is assumed that "intermediate data 1" is set as an intermediate of conversion from a "source 1" to a "target 1", "intermediate data 2" is set as an intermediate of conversion from a "source 2" and a "source 3" to a "target 2" and a "target 3", and further an intermediate of conversion from the "source 3" to the "target 3" is not set. Further, it is assumed that mutual conversion is set between the "intermediate data 1" and the "intermediate data 2". In this case, the interpreter is configured to hide, from a user, complicated processing of a portion G enclosed by "processing Generate".

The interpreter performs automatic data conversion upon generating intermediate data as necessary in the inside thereof. For example, conversion from the "source 3" to the "target 1" in the case as illustrated in FIG. 3B is considered. In this case, a path (the "source 3"->"intermediate data 2"->"intermediate data 1"->the "target 1") may be expected. The interpreter has a conversion relationship (i.e., an inheritance relationship) of classes, and during actual conversion from the "source 3" to the "target 1", the interpreter generates required intermediate data based on the conversion relationship.

Before the actual conversion, the interpreter assumes multiple conversion paths, and for each of them, the interpreter is configured to calculate the cost of conversion (for example, the number of times the conversion (inheritance) indicated by the arrows is used). For example, conversion from the "source 3" to the "target 3" as illustrated in FIG. 3B is considered. In this case, although a path (the "source 3"->"intermediate data 2"->the "target 3") and a path (the "source 3"->"intermediate data 2"->"intermediate data 1"->"intermediate data 2"->"intermediate data 1"->the "target 3") are not unthinkable, it is clear that a path (the "source 3"->the "target 3") is the fastest and most efficient. In this manner, the interpreter attempts to automatically determine the conversion path that is as efficient and fast as possible.

3.1. Difference in Characteristics Between DPP and Conventional Object-Oriented Programming Difference in characteristics between the DPP and conventional object-oriented programming lies in the combinations shown in the above-described table.

In this case, "expression formats being different" is explained. A "text format" and a "binary format" are an example of different expression formats.

Further, for example, in a case of image data, and in a case where the image data is png, jpeg, bmp, tif, or moving picture data, there are numerous expression formats such as avi, mpeg, mov, wmv, and the like, and if there is a difference in the file formats, the expression formats are different.

In text formats, due to a difference in the line feed code, there are different text formats such as:
an expression format in which the line feed code is LF;
an expression format in which the line feed code is CR+LF; and
an expression format in which the line feed code is CR.

In the classes of C++ language, the following classes A and B are different in the order of storage of data, and are therefore different expression formats.
class A {double x; double y;};
class B {double y; double x;};

Programming languages are also one of expression formats for expressing instructions to computers, and different programming languages, such as C++, C, Fortran, Python, and the like, are different in expression formats.

Whether the gender is described as "M", "F" or as "Male", "Female" can also be considered as a definition of expression formats (i.e., expression formats are different).

3.2. Tree Structure in which Objects are Associated with Nodes

In the present disclosure, interpretation of data and integration of data are performed by establishing a tree structure (an example of a graph) in which objects are associated with nodes. In general, the tree structure is constituted by nodes, which are constituent elements of the tree structure, and parent-and-child relationships between two nodes, and each node includes at most one node corresponding to a parent of a parent-and-child relationship. Only one node that corresponds to a node corresponding to a parent of a parent-and-child relationship is specifically referred to as a root node and exists in the tree structure. In the tree structure of the present disclosure, only one object is associated with each node, and also, the same objects can be associated with different nodes of the tree structure. The parent-and-child relationship according to the tree structure of the present disclosure is a binary relation defined by the predicate logic L2 of the data processing platform. In the present disclosure, when downcast occurs in an object associated with a node of the tree structure, a child node is newly generated with respect to that node on the basis of a parent-and-child relationship defined by the predicate logic L2 for the downcast new data type. Specifically, downcast of an object associated with each node of the tree structure may grow the tree structure.

4. [First Embodiment]

Next, a data interpretation method and a data interpretation apparatus according to the first embodiment is explained.

4.1. Configuration of Data Interpretation Apparatus

FIG. 1 is a drawing illustrating a physical configuration of a data interpretation apparatus 2 according to the present embodiment. The data interpretation apparatus 2 includes a control unit 4 corresponding to a hardware processor, a RAM (Random Access Memory) 6 corresponding to a memory, a ROM (Read Only Memory) 8 corresponding to a memory, a communication unit 12, an input unit 14, and an output unit 16. These elements are connected to one another via a bus 10 so that data can be transmitted and received.

The control unit 4 performs control related to execution of programs stored in the RAM 6 or the ROM 8 and performs calculation and processing of data. The control unit 4 is a computation apparatus for executing various programs (for example, programs for data interpretation). The control unit 4 receives various kinds of input data from the input unit 14 and the communication unit 12, displays computation results of input data on the output unit 16, stores them to the RAM 6 and the ROM 8, and transfers them via the communication unit 12 to an external server. The control unit 4 is constituted by a CPU (Central Processing Unit) or the like.

The RAM 6 is a storage unit capable of rewriting data, and is constituted by, for example, a semiconductor storage device. The RAM 6 stores programs such as applications executed by the control unit 4 and stores data.

The ROM 8 is a storage unit capable of reading data, and is constituted by, for example, a semiconductor storage device. The ROM 8 stores, for example, programs such as firmware and stores data.

The communication unit 12 is a communication interface for connecting the data interpretation apparatus 2 to an external network 20.

The input unit 14 receives an input of data from the user, and is constituted by, for example, a keyboard, a mouse, a touch panel, and a scanner. For example, in a case where non-structured data such as 2D-CAD drawings is read as input data, image data (raster data) using a scanner can be obtained.

The output unit 16 visually displays a computation result by the control unit 4, and is constituted by, for example, an LCD (Liquid Crystal Display).

Programs for data interpretation may be provided by being stored in a storage medium readable by a computer such as the RAM 6, the ROM 8, and the like, and may be provided from an external server 24 via the external network 20 connected by the communication unit 12. CAD data and objects based on CAD data are preferably provided from the external server 24 and the like via the external network 20 connected by the communication unit 12. In the data interpretation apparatus 2, the control unit 4 executes programs for data interpretation to achieve various functions such as an obtaining unit 5a and an interpretation unit 5b. These physical elements are merely examples, and do not have to be necessarily independent elements. For example, the data interpretation apparatus 2 may have an LSI (Large-Scale Integration) and a VLSI (Very Large-Scale Integration) in which a CPU, the RAM 6, and the ROM 8 are integrated.

The control unit 4 is provided with a platform (the data processing platform in this case) 5. The platform 5 includes functional blocks including the obtaining unit 5a and the interpretation unit 5b.

The obtaining unit 5a obtains input data as an object. The input data may be structured data, or may be non-structured data.

The interpretation unit 5b generates an initial tree structure for an object obtained by the obtaining unit 5a. Further, the interpretation unit 5b adopts, as an interpretation of input data, a result obtained by automatically growing the tree structure from an initial tree structure. In this interpretation, the interpretation unit 5b executes, as necessary, type conversion of an object associated with each node of the tree structure to the extension-side or the intension-side.

4.2. Operation of Data Interpretation Apparatus

Figure 4:
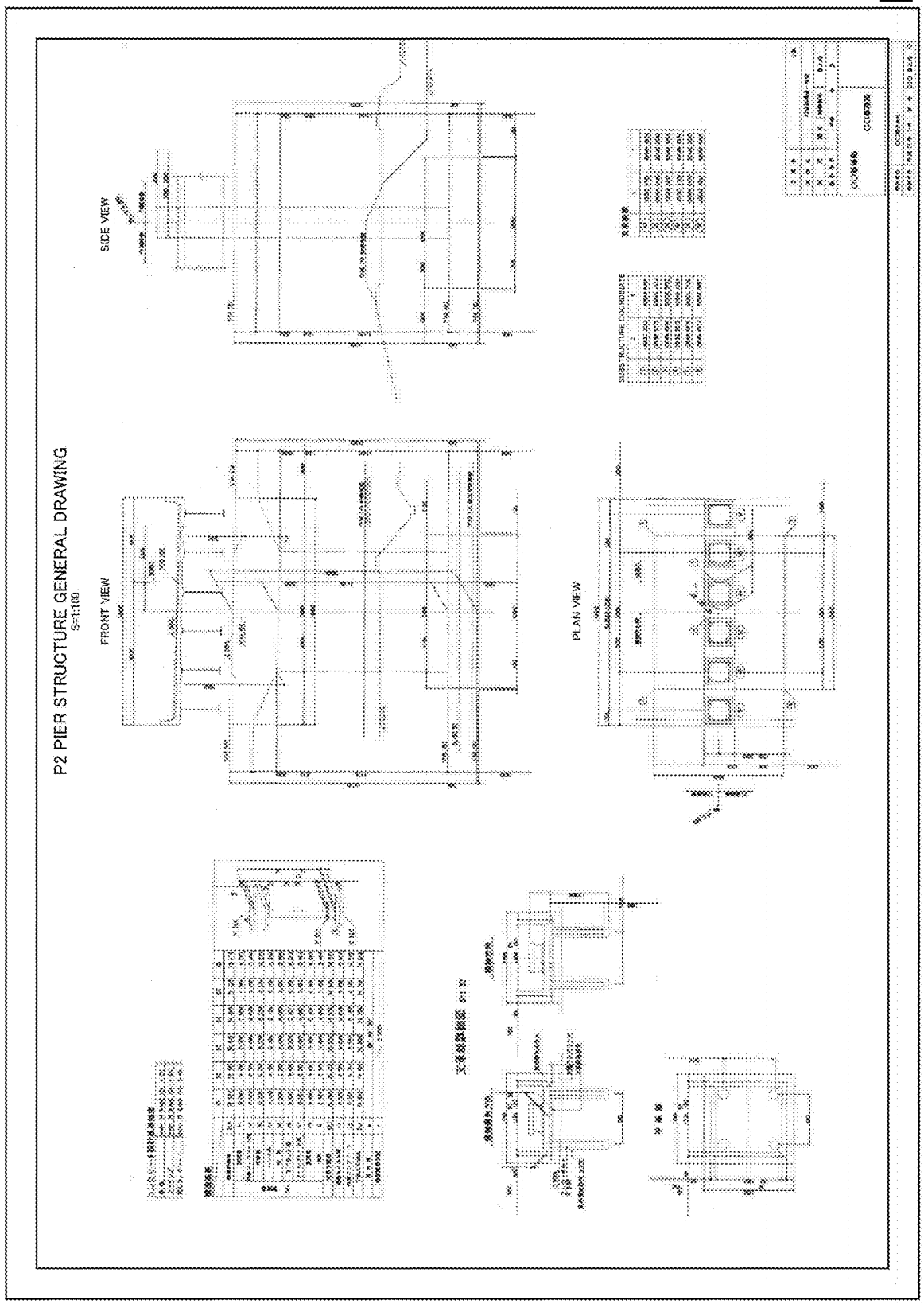
FIG. 4 is an example of a pier structure general drawing illustrating a pier structure constituted by CAD data.

FIG. 4 is an example of a pier structure general drawing illustrating a pier structure, constituted by CAD data. Data of the pier structure general drawing of the CAD data includes constituent elements such as line segments, curves, character strings, and the like, and an assembly of constituent elements may be interpreted as a "drawing" such as a plan view and a front view and a "table" such as various tables.

4.2.1. Process of Interpreting Data

Figure 18:
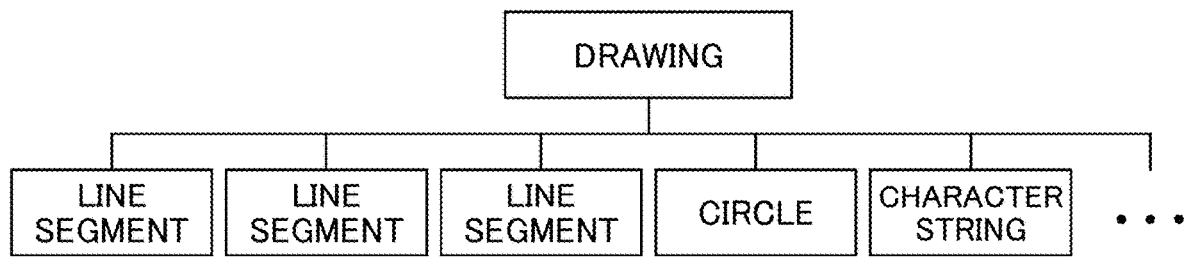
FIG. 18 is a drawing illustrating an initial tree structure for drawing interpretation.

This is a process for receiving a design drawing object as an input and generating a tree structure in which an object representing an element of a drawing is associated with a node, and the generated tree structure becomes an interpretation result of the drawing. As illustrated in FIG. 18, the tree structure in which elements of a line segment, a character string, a circle, and the like included in the drawing are all arranged in the same class is adopted as the initial tree structure, and the tree structure is successively grown. However, in a case where elements in the drawing data are established from the beginning, a tree structure reflecting the structure may be adopted as the initial tree structure. For example, FIG. 19 illustrates, as an example of growth of a tree structure, a process for recognizing a leader line-attached text balloon. In FIG. 19, in a case where a circle in the drawing includes a character string (upper row), two are collectively interpreted as a text balloon (middle row), and further, in a case where a broken line is connected to a balloon, the bent line is deemed as a leader line (lower row). Specifically, the text balloon is recognized from an inclusion relationship of the circle element and the character string element, and a leader line is recognized from the connection between the text balloon and the line segment element. The parent-and-child relationship of the tree structure indicates a context explicitly stating the usage of elements of the drawing, so that a role of "leader line" is allocated to a line segment element that is a portion of the leader line-attached text balloon.

4.2.2. Operation of Interpreting "Title Block" that is Table

A procedure for interpreting a "title block" as illustrated in FIG. 5 in the pier structure general drawing as illustrated in FIG. 4 is explained. The CAD drawing standard (Ministry of Land, Infrastructure, Transport and Tourism) stipulates that the "title block" is to be described at the lower right corner of the pier structure general drawing. In the example of the pier structure general drawing as illustrated in FIG. 4, the "title block" is provided at the lower right corner. Further, the "title block" is constituted by lines and character strings in CAD data.

Figure 6:
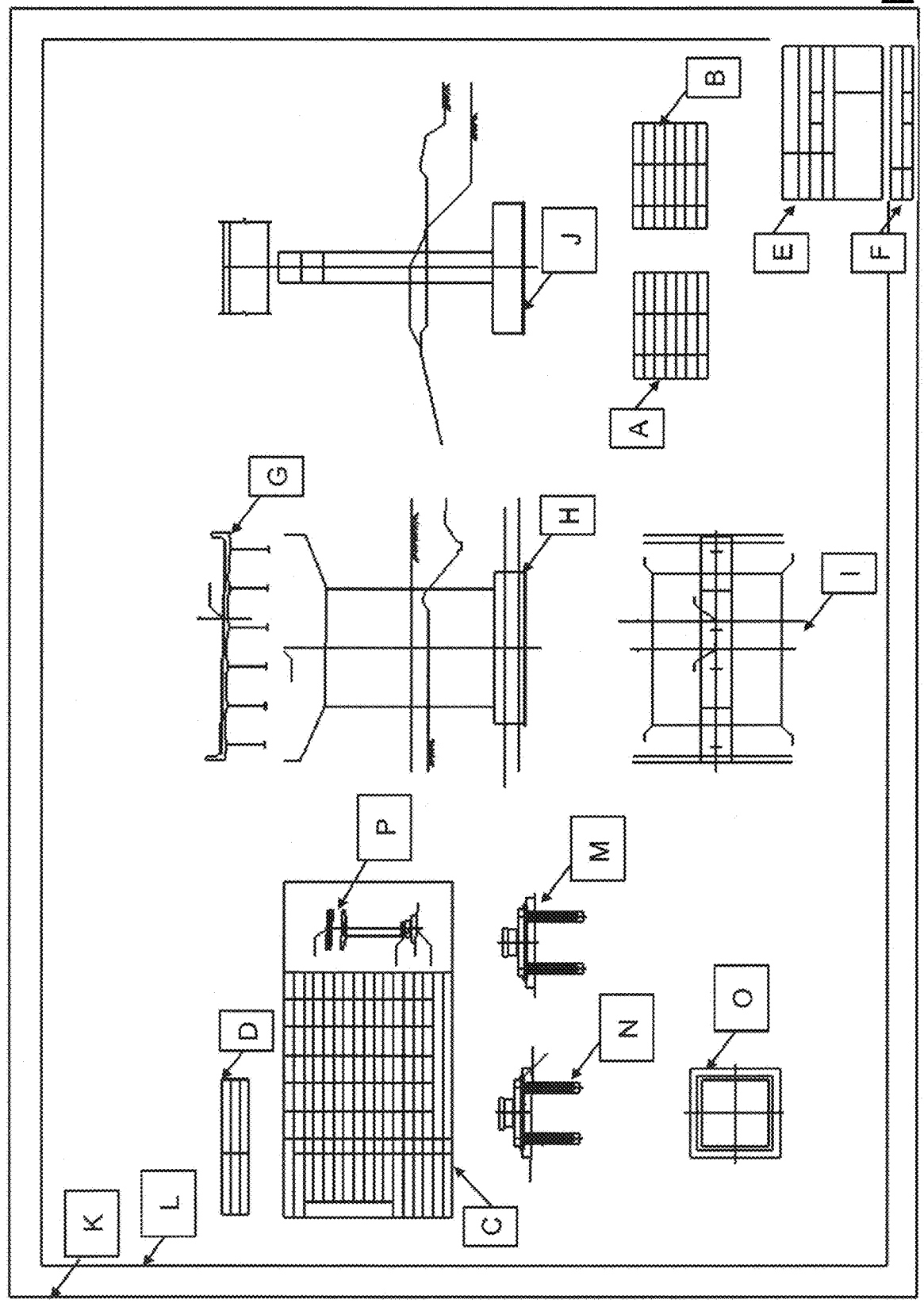
FIG. 6 is a drawing illustrating an object (class name "LineBuf2D") constituted by lines in the "pier structure general drawing".

First, in the CAD data "pier structure general drawing", data of an assembly of lines is made into an object (the class name is, for example, "LineBuf2D"). FIG. 6 is a drawing illustrating objects (class name "LineBuf2D") constituted by lines in the "pier structure general drawing". Sixteen objects "A" to "P" are shown.

Figure 7:
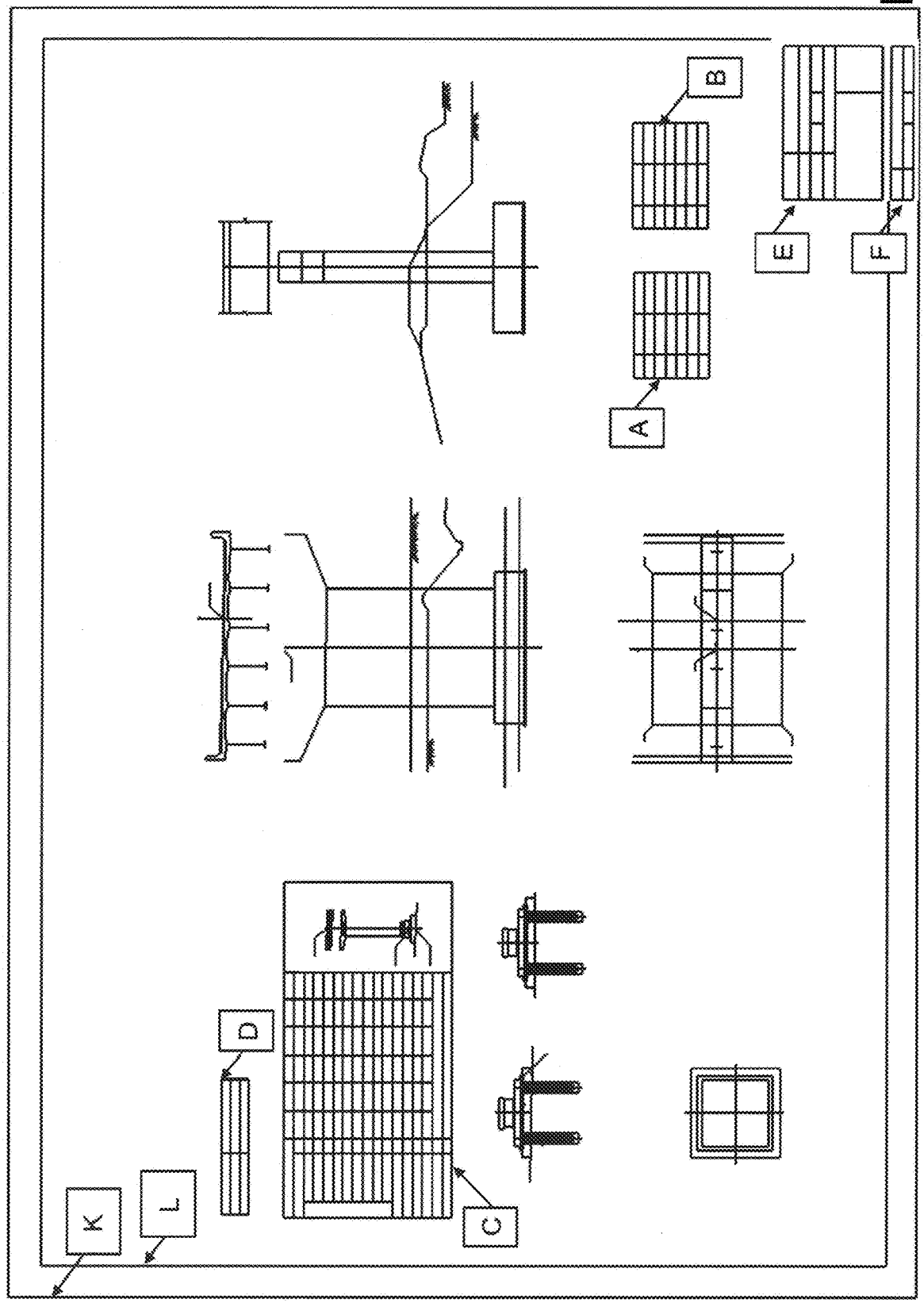
FIG. 7 is a drawing indicating that objects that are not in the subclass "CellSet" are excluded from objects of collections of lines (a class name "LineBuf2D"), and six objects are interpreted as "CellSet".

Next, as illustrated in FIG. 6, from the objects of collections of lines (class name "LineBuf2D"), objects that cannot be interpreted as sets of cells are excluded from candidates of "title block". In this case, a class "CellSet" is defined for a set of cells, and accordingly, downcast from objects of collections of lines (class name "LineBuf2D") to a subclass "CellSet" is automatically executed. FIG. 7 is a drawing indicating that objects of collections of lines (class name "LineBuf2D") are downcast to a subclass "CellSet" and the candidates of the "title block" are the remaining eight objects. The objects "A", "B", "C", "D", "E", "F", "K", and "L" are the candidates of the "title block".

In order to remove objects that cannot be interpreted as a set of cells from objects of collections of lines (class name "LineBuf2D"), a function for downcast from the class "LineBuf2D" is defined in advance in the subclass "CellSet". In this case, the function defined in advance for downcast from the superclass to the subclass is referred to as an input function. Objects that fail to downcast are excluded from the candidates of "title block". In this case, an inheritance relationship of the subclass "CellSet" and the class "LineBuf2D" depends on an extension-and-intension relationship that, when an object is interpreted as a set of cells "CellSet", the object is to be interpreted as an assembly "LineBuf2D" of lines (see the above-described (condition 2)).

Further, when objects that cannot be interpreted as sets of cells are excluded from objects of collections of lines (class name "LineBuf2D"), a value indicating how much likely downcast occurs from the superclass to the subclass (for example, a value indicating the percentage of the probability that an object interpreted as a set of cells is actually a set of cells), a likelihood, can be given to an object during conversion (during execution of the input function) to the subclass. During calculation of the likelihood, the likelihood given to the superclass can be referred to.

Figure 8A:
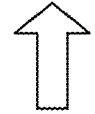
FIG. 8A is a drawing indicating that a character string and the like extracted from the CAD data are input to the object of the class "CellSet", and the object is interpreted as the class of "Table".

Next, as illustrated in FIG. 8A, it is attempted to downcast an object of the class "CellSet" to the subclass "Table". In this case, the object of the superclass "CellSet" and the elements (lines, character strings, and the like) of the CAD data are input into the input function, and the elements included in each cell of the set of cells are extracted. In a case where a certain number of character strings and the like are input into the object of the class "CellSet", an input function can be defined for successful downcast, and the object that has been downcast to the class "Table" is interpreted as "Table".

Next, as illustrated in FIG. 8B, it is checked whether a predetermined item, i.e., an item of "drawing name" in this case, exists in the object of the class "Table". If the predetermined item exists, the object is downcast to an object of the class "title block", and the object is interpreted as a "title block". In this case, downcast is executed, regardless of the input function, on the basis of a function for determining whether downcast is possible based on internal data of the class (referred to as "is function") and a function for actually executing the downcast (referred to as "cast function") that are defined in advance in the class. In this case, downcast performed with the "is function" and the "cast function" is referred to as downcast by analysis and classification. The "title block" is interpreted in this manner.

In this case, an operation for interpreting the "title block", i.e., a table, is explained briefly from the viewpoint of growing the tree structure. FIG. 21 illustrates a process for recognizing the "title block" defined in the CAD drawing standard (Ministry of Land, Infrastructure, Transport and Tourism). For the recognition of the "title block", first, as illustrated in FIG. 21 (1), an assembly of connected line segments is extracted, and whether it is a "frame of a table" is determined from arrangement situations of line segments. As illustrated in FIG. 21 (2), in a case where the assembly of connected line segments is determined to be the "frame of the table", information about the cell of the table is recorded in the object that expresses the "frame of the table". Further, by using this cell information, whether a character string is arranged in the cell is checked from the drawing, and in a case where the character string is arranged, the assembly of connected line segments is determined to be a "table" (FIG. 21 (3)), and the character string is stored as information about the cell. With respect to the table of the drawing according to the CAD drawing standard, when a condition that, e.g., there is a "name of construction" as an item of the cell, is satisfied, the "table" can be recognized as a "title block" as illustrated in FIG. 21 (4).

4.2.3. Operation of Interpreting "Pier Front View", i.e., Drawing

Next, a procedure for interpreting a "pier front view", i.e., a drawing, in the pier structure general drawing as illustrated in FIG. 4 is explained. In FIG. 4, the "pier front view" is provided in the upper center portion.

First, in the CAD data "pier structure general drawing", data that is an assembly of lines is made into an object (class name "LineBuf2D"). FIG. 6 is a drawing illustrating an object constituted by lines in the "pier structure general drawing". Sixteen objects "A" to "P" are shown.

Figure 9:
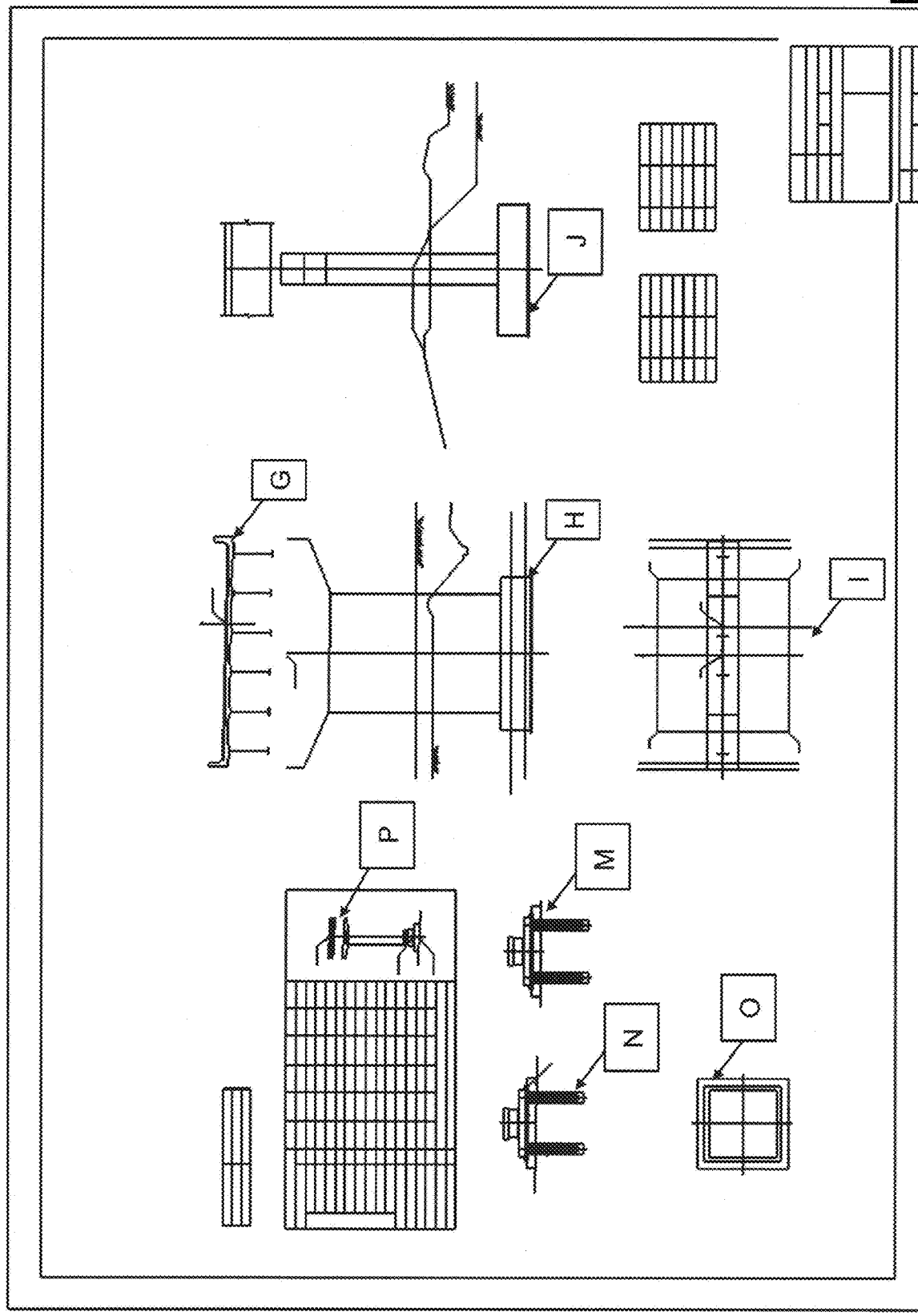
FIG. 9 is a drawing indicating that objects that are not in the subclass "View" are excluded from objects of collections of lines (class name "LineBuf2D"), and eight objects are interpreted as "View".

Next, in order to exclude objects that cannot be interpreted as drawings "View" attached with a size value from objects of collections of lines (class name "LineBuf2D"), a function for downcast from a class "LineBuf2D" is defined in advance in the subclass "View". Objects that fail to downcast are excluded from the candidates that are interpreted as "View". In this case, an inheritance relationship of the subclass "View" and the class "LineBuf2D" depends on an extension-and-intension relationship that, when an object is interpreted as a drawing "View" attached with a size value, the object is to be interpreted also as an assembly "LineBuf2D" of lines (see the above-described (condition 2)). FIG. 9 is a drawing illustrating the remaining eight cells after objects that are not in the subclass "View" are excluded from objects of collections of lines (class name "LineBuf2D"). The cells "G", "H", "I", "J", "M", "N", "O", and "P" are remaining.

When objects of collections of lines (class name "LineBuf2D") are downcast to the drawings "View" attached with a size value, a likelihood that is a value indicating how likely downcast occurs from the superclass to the subclass (for example, a value indicating by percentage the probability that an object interpreted as a drawing attached with a size value is actually a drawing attached with a size value) can be given to an object during conversion to the subclass.

Figure 10:
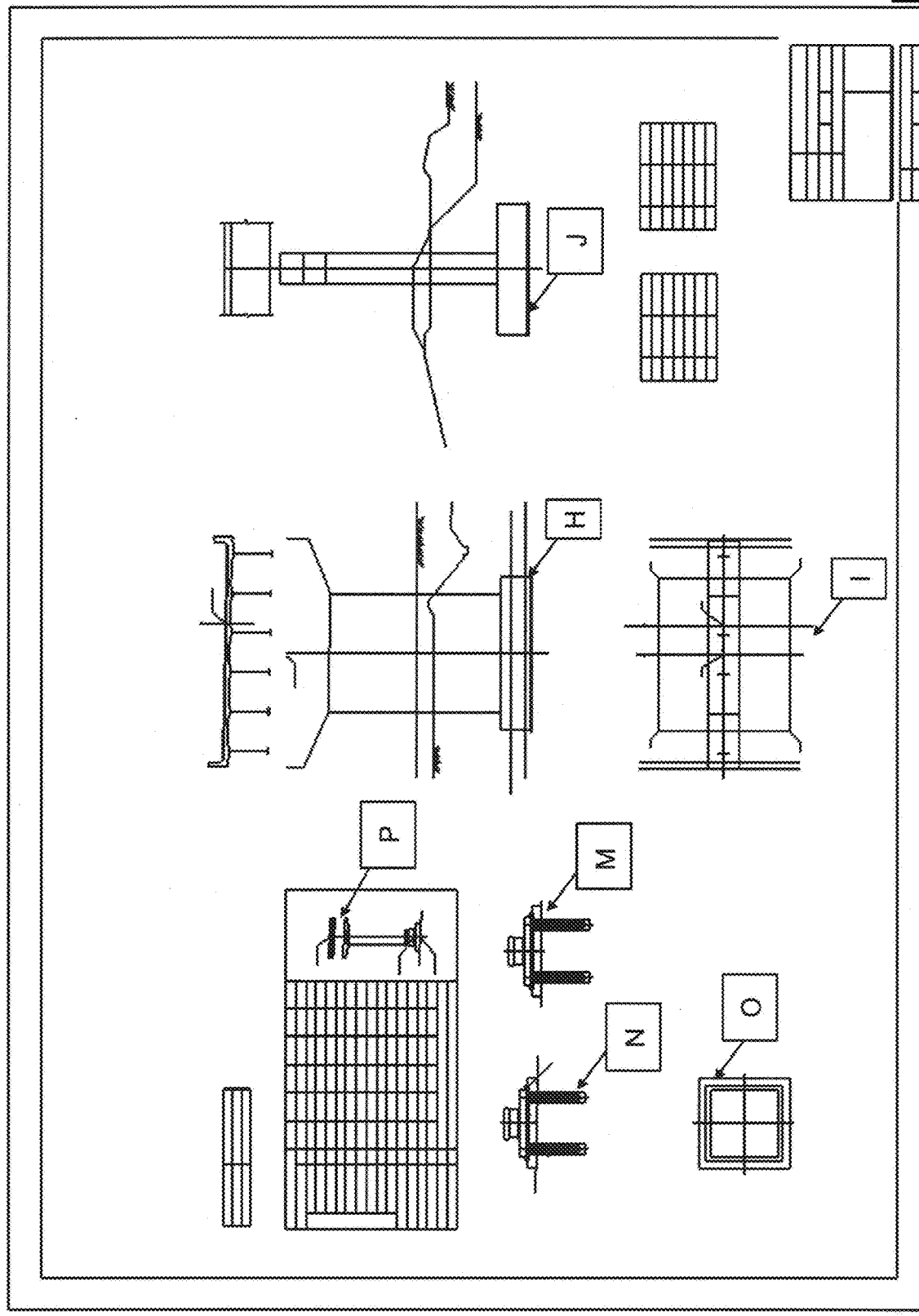
FIG. 10 is a drawing illustrating remaining seven cells after an object that does not belong to the main structure (D-STR) layer is excluded from the eight objects of the class name View as illustrated in FIG. 9.

In order to determine whether an object is a "pier front view", a predetermined item of internal data of an object, i.e., a layer in this case, is referred to, and whether there are child elements of an object that belong to a main structure (D-STR) layer is analyzed and classified. If all the elements of the object are determined not to belong to the main structure (D-STR) layer, the object is excluded from candidates of the "pier front view". In FIG. 10, the object that does not belong to the main structure (D-STR) layer is excluded from the eight objects of the class name View as illustrated in FIG. 9. Accordingly, seven objects are indicated with "H", "I", "J", "M", "N", "O", and In the downcast using the input function (referred to as downcast with input of information), whether downcast is possible can be determined by using not only unique internal data that the object individually has but also additional information. As illustrated in FIG. 11, with respect to the object of the class "View", a character string indicating a title is input from the CAD data, and the object is interpreted as a "pier front view". In the manner as described above, the "pier front view" that is a drawing is interpreted.

4.2.4. Summary of Operation for Interpreting Drawing

With a data interpretation apparatus and a data interpretation method according to the present embodiment, the meaning and the content of 2D-CAD drawings are recognized in a stepwise manner.

Figure 13:
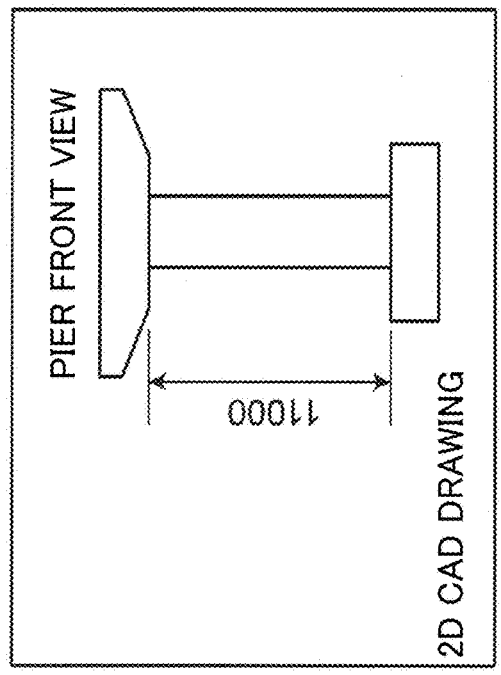
FIG. 13 is a drawing indicating that a "pier front view" included in a 2D-CAD drawing is recognized in a stepwise manner.

As illustrated in FIG. 13 (1) and FIG. 13 (2), attention is focused on lines in various drawings such as a front view, a plan view, and the like. Specifically, data that is an assembly of lines is made into an object (class name "LineBuf2D"). Next, as illustrated in FIG. 13 (2), FIG. 13 (3), and FIG. 13 (4), upon inputting a size value and the like from the drawing, the object is interpreted as an object of the class name "View", and further, the object is determined to be an object of the class name "pier front view". Further, information indicating that the height of the pillar of the pier is 11 m can be obtained from the size value and the projection plane of the internal data of "View".

Figure 14:
FIG. 14 is a drawing indicating that a "substructure coordinate table" included in a 2D-CAD drawing is recognized in a stepwise manner.

As illustrated in FIG. 14 (1) and FIG. 14 (2), attention is focused on lines in various drawings. Specifically, data that is an assembly of lines is made into an object (class name "LineBuf2D"). Next, as illustrated in FIG. 14 (2) and FIG. 14 (3), the object is interpreted as an object of the class name "CellSet". Next, as illustrated in FIG. 14 (3) and FIG. 14 (4), upon inputting the content of the cell such as a character string from the drawing, the object is determined to be an object of the class name "Table", and further, the object is interpreted as an object of a class name "substructure coordinates".

Figure 15:
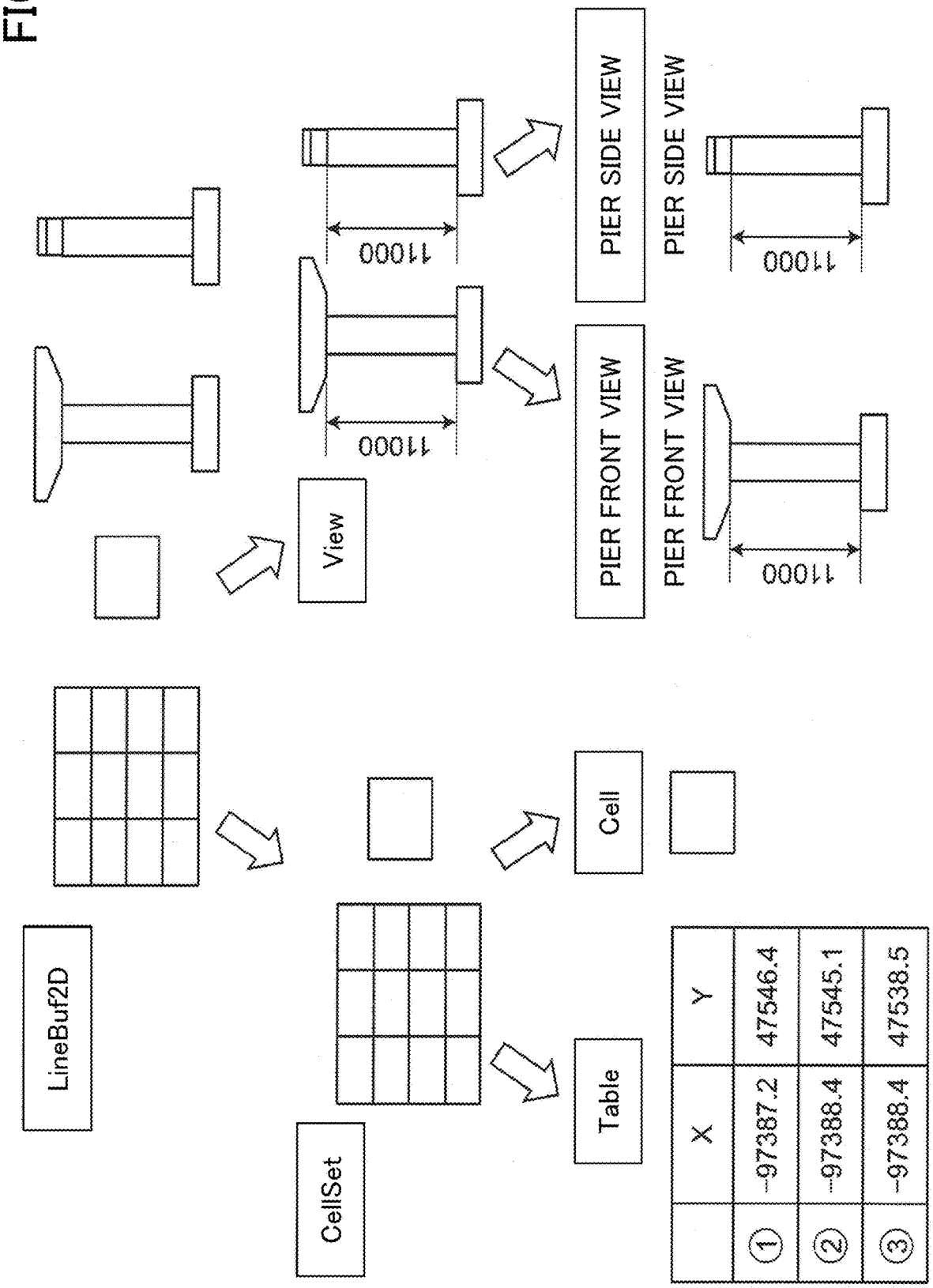
FIG. 15 is a drawing indicating that steps for 2D-CAD drawing recognition are made into a hierarchical structure in the data interpretation apparatus and data interpretation method according to the present disclosure.

As illustrated in FIG. 15, in various tables, objects of collections of lines (class name "LineBuf2D") are interpreted as objects of sets of cells (class name "CellSet"), and further, the objects are interpreted as an object of which multiple cells are filled with contents (class name "Table") and an object including only one cell (class name "Cell").

Likewise, as illustrated in FIG. 15, in various drawings, objects of collections of lines (class name "LineBuf2D") are interpreted as objects that are drawings attached with size values (class name "View"), and further, the objects are interpreted as an object having an item unique to a "pier front view" (class name "pier front view") and an object having an item unique to a "pier side view" (class name "pier side view").

As illustrated in FIG. 16, in the present embodiment, two ways are set as recognition techniques of 2D-CAD drawings. (1) "Input of information" and (2) "Analysis and interpretation".

As illustrated in FIG. 16 (1) as an example, information on the drawing is input to an object of a set of cells (class name "CellSet") as additional information from input data, so that the object can be interpreted as an object of the class name "Table".

As illustrated in FIG. 16 (2) as an example, in the object of the class name "Table", items and the like are analyzed and classified and then downcast, so that an object of a class name "title block", an object of a class name "structure height table", and an object of a class name "coordinate Table" can be interpreted.

FIG. 27 is an example of a script for interpreting a 2D-CAD drawing "006_P2pier structure general drawing-.dxf". This script is an example of language that can be understood by the data processing platform according to the present disclosure. Naturally, as long as the requirements hereinabove described are satisfied, the data processing platform according to the present disclosure may be another interpreter that is different from the interpreter created by the present. The script may be a language that can be understood by the another interpreter.

5. [Second Embodiment]

A data integration apparatus 2' according to the present embodiment generates a representation-target model of data by integrating fragmentary information distributed across multiple pieces of data.

The data integration apparatus according to the second embodiment is explained with reference to FIG. 22.

5.1. Configuration of Data Integration Apparatus

Figure 22:
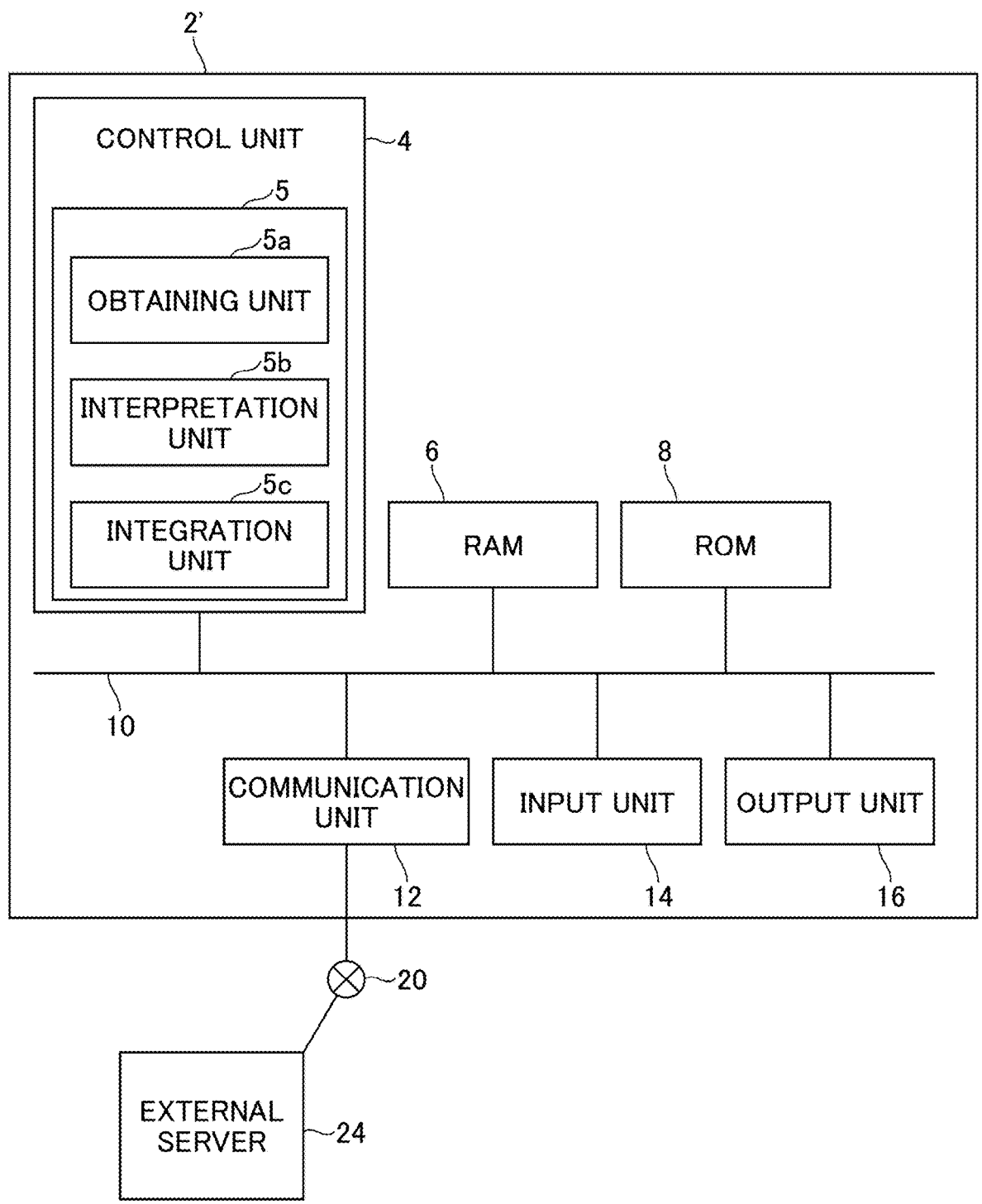
FIG. 22 is a drawing illustrating a physical configuration of a data integration apparatus according to a second embodiment.

FIG. 22 is a drawing illustrating a physical configuration of a data integration apparatus 2' according the present embodiment. The data integration apparatus 2' includes a control unit 4 corresponding to a hardware processor, a RAM (Random Access Memory) 6 corresponding to a memory, a ROM (Read Only Memory) 8 corresponding to a memory, a communication unit 12, an input unit 14, and an output unit 16. These elements are connected to one another via a bus 10 so that data can be transmitted and received. The communication unit 12 is a communication interface for connecting the data integration apparatus 2' to an external network 20. The data integration apparatus 2' is also connected to the external server 24 via the external network 20 connected by the communication unit 12. The RAM 6, the ROM 8, the communication unit 12, the input unit 14, the output unit 16, and the bus 10 are similar to those of the first embodiment as illustrated in FIG. 1.

The control unit 4 is provided with a platform (the data processing platform in this case) 5. The platform 5 includes an obtaining unit 5a, an interpretation unit 5b, and an integration unit 5c.

The obtaining unit 5a obtains input data as an object. The input data may be structured data, or may be non-structured data.

The interpretation unit 5b generates an initial tree structure with respect to an object. Further, the interpretation unit 5b adopts, as an interpretation of input data, a result obtained by automatically growing the tree structure from an initial tree structure. In this interpretation, the interpretation unit 5b executes, as necessary, type conversion of an object associated with each node of the tree structure to the extension-side or the intension-side.

The integration unit 5c generates an initial tree structure for each representation target of an object obtained by the obtaining unit 5a. Also, the integration unit 5c reads fragmentary information of the representation target by executing, as necessary, interpretation of the interpretation unit 5b on the object obtained by the obtaining unit 5a. Further, the integration unit 5c makes, as integrated data, a result obtained by automatically growing a tree structure from the initial tree structure, by giving, as additional information, one or multiple fragmentary information to the initial tree structure. The integrated data is a representation-target model.

During generation of the integrated data, the integration unit 5c executes, as necessary, type conversion of an object associated with each node of the tree structure to the extension-side or the intension-side.

According to the above configuration, the data integration apparatus 2' according to the present embodiment makes desired data by integrating multiple pieces of fragmentary information extracted from multiple pieces of data that are materials.

Also, the data integration apparatus 2' according to the present embodiment automatically performs data conversion of data structures of objects of which expression formats are different, automatically finds a path of the type conversion, and further, automatically makes integrated data.

5.2. Operation of Data Integration Apparatus

Figure 17:
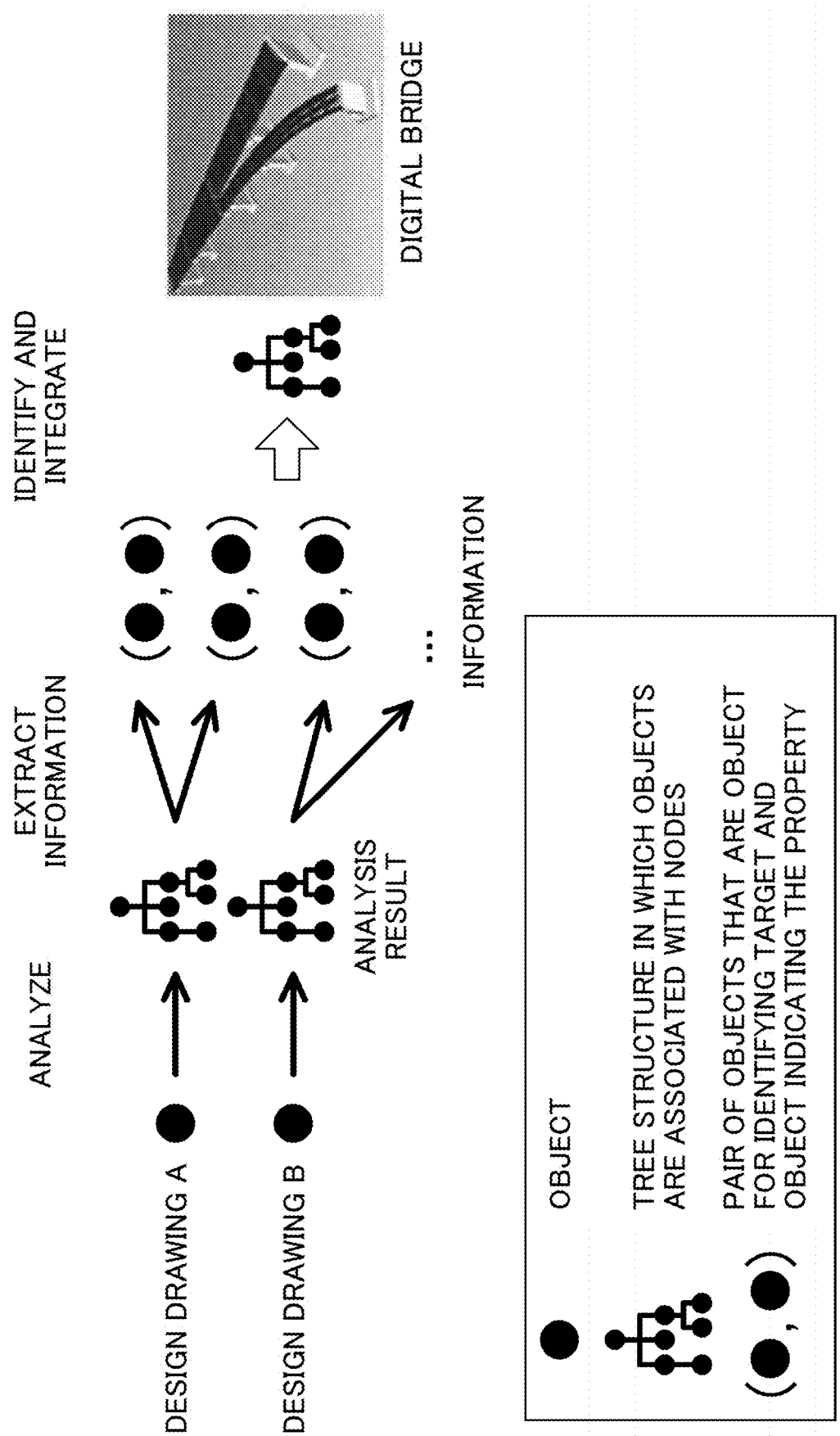
FIG. 17 is a drawing illustrating a flow of a digital bridge automatic generation technique.

A flow of a digital bridge automatic generation technique according to the present disclosure is illustrated in FIG. 17. The input data group is individually interpreted, and multiple pieces of information are extracted from the interpretation result. The digital bridge is established by grouping and integrating information according to representation targets thereof. The process of the digital bridge automatic generation is constituted by the following three.

(1) Process of interpreting data
(2) Information extraction process
(3) Identification and integration process The first embodiment is an example including (1) and (2), and the second embodiment includes (1) to (3).

5.2.1. (1) Process of Interpreting Data

A process of interpreting data has been explained in "4.2.0. Process of interpreting data".

5.2.2. (2) Information Extraction Process

The actual target expressed in the drawing is identified from an interpretation result of the drawing, and information is summarized as a set of expressions about the target. In the following explanation, this process is simplified, and names of the targets such as a "P1 pier" and an "A2 bridge abutment" are used as objects for identifying the targets.

5.2.3. (3) Identification and Integration Process

Integration of multiple pieces of information obtained in an information extraction process is performed by generating one graph from multiple pieces of information. This graph includes, as a portion of the graph, a representation target (for example, "P1 pier" and "A2 bridge abutment") identified from the information, and information about the respective representation targets is also gathered and integrated as a portion of the graph. According to a process of this integration, an automatic structuration is performed by growing a tree structure in a similar manner to interpretation of a drawing. The tree structure that is a target of automatic structuration is a portion of the graph, and a parent-and-child relationship of the tree structure can be a relationship between the entirety and a portion between nodes (for example, a relationship between a pier and a base). The initial tree structure may be a single node that abstractly expresses the representation target (for example, may be such that an object is associated with a node where the object is simply known to be a pier). The tree structure is grown by generating a more detailed extension-side object from an intension-side object according to an extension-and-intension relationship between objects. This corresponds to a downcast in the object-oriented programming, and cannot be appropriately executed because information is insufficient in conventional downcast that takes only internal data of the object into consideration. However, this process may be appropriately executed by referring to a portion of the graph reflecting information extracted from the drawing. The detailed object generated in this case may be deemed as an integration of information expressed as the graph. In addition, because the tree structure (and also the graph including the tree structure) grows according to the generated object, it is attempted to perform downcast according to the graph at that point in time every time the tree structure grows. In order to generate an object of a three-dimensional model, information extracted from the drawing may be insufficient. In this case, for example, the graph can be modified by engineering knowledge or some estimation technique.

In the information extraction process, information can be an assembly of a natural language-style sentence such as "the height of the pier of which the name is :"P1": is :Q("10 m"):;". In order to integrate the content of multiple sentences, the sentences are expressed with graphs, and the nodes of the graphs are identified to integrate them into a single graph. However, without being expressed with the graph, the sentence may include a description of a rule for modifying the integrated graph, and the graph may be modified as necessary by applying this rule.

5.2.4. Application to Two-Dimensional CAD Drawing

Figure 12A:
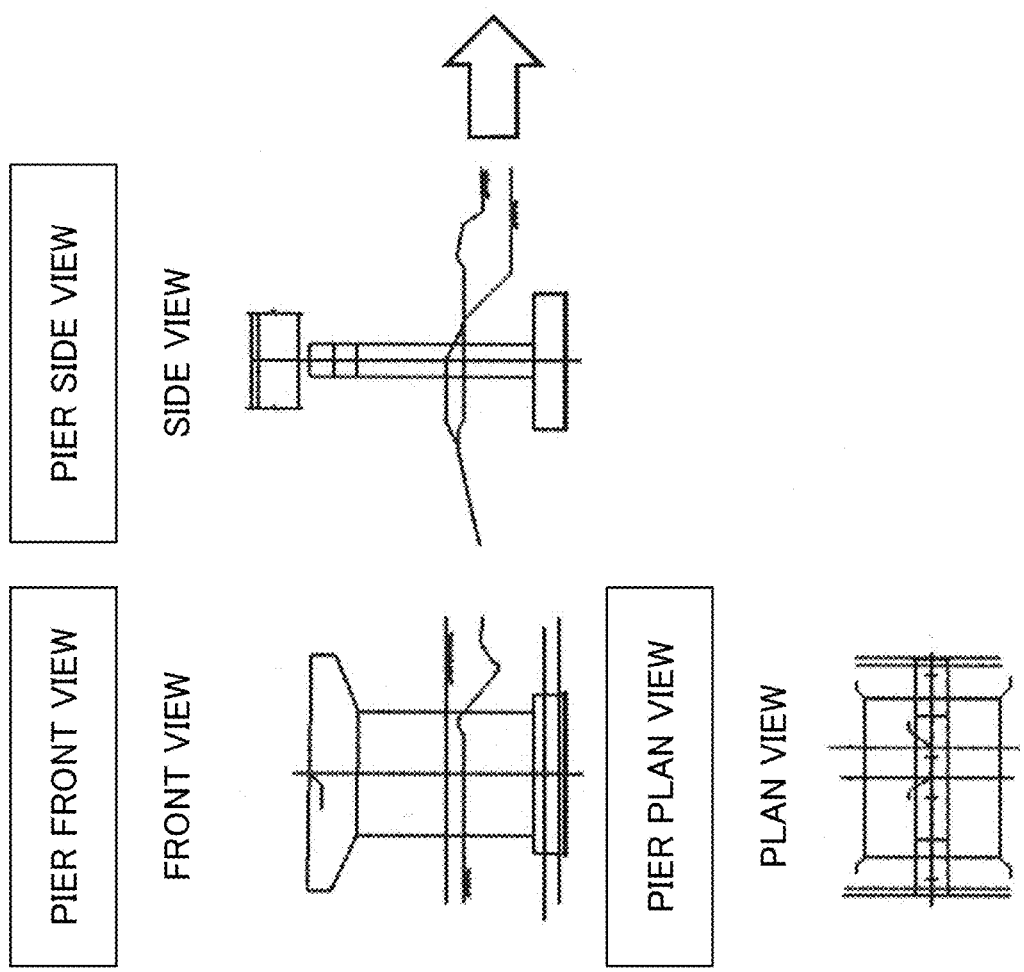
FIG. 12A is a drawing illustrating how a projection plane of a building is automatically generated from a front view, a plan view, and a side view.
Figure 12B:
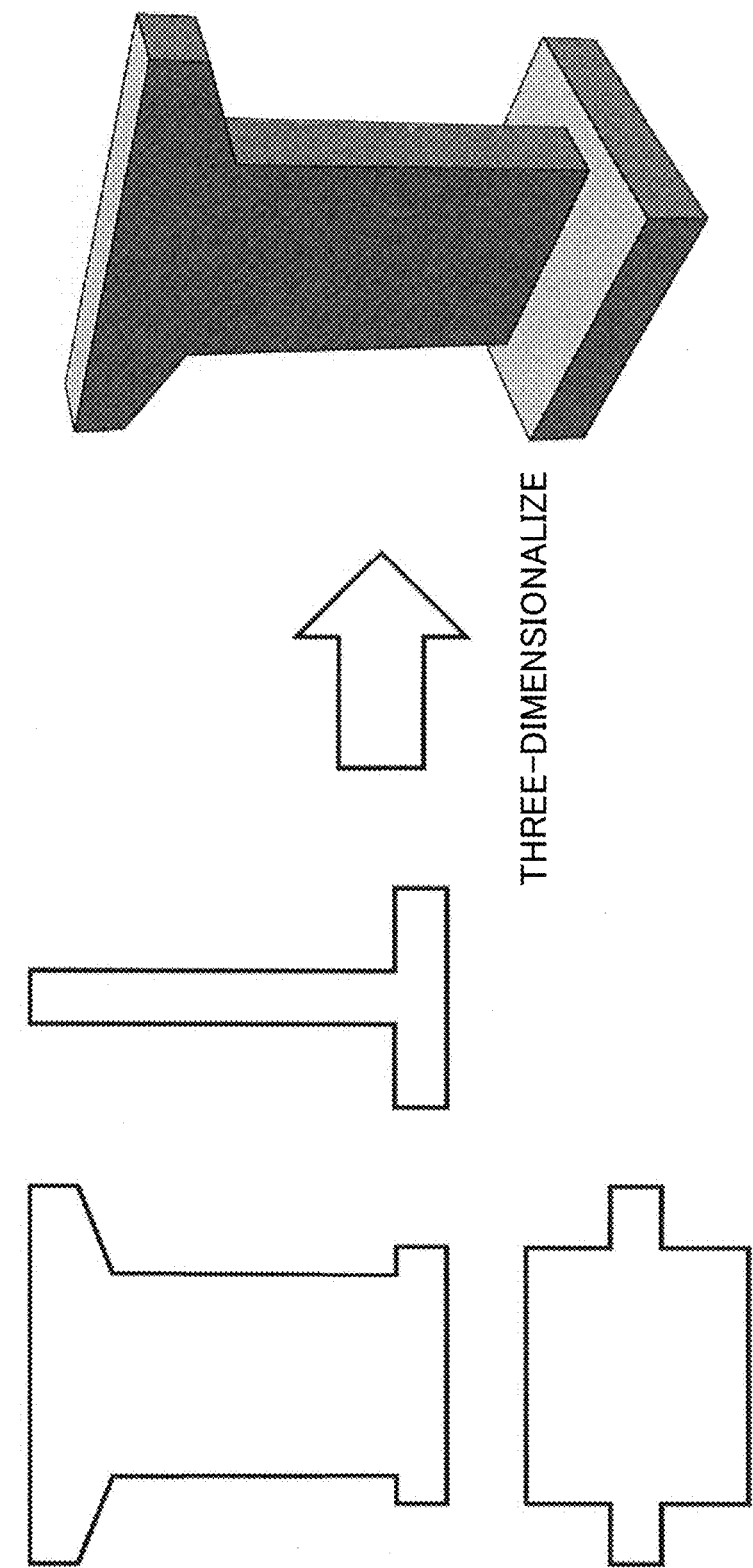
FIG. 12B is a drawing illustrating how a three-dimensional model is automatically generated from the projection plane of the building.
Figure 20:
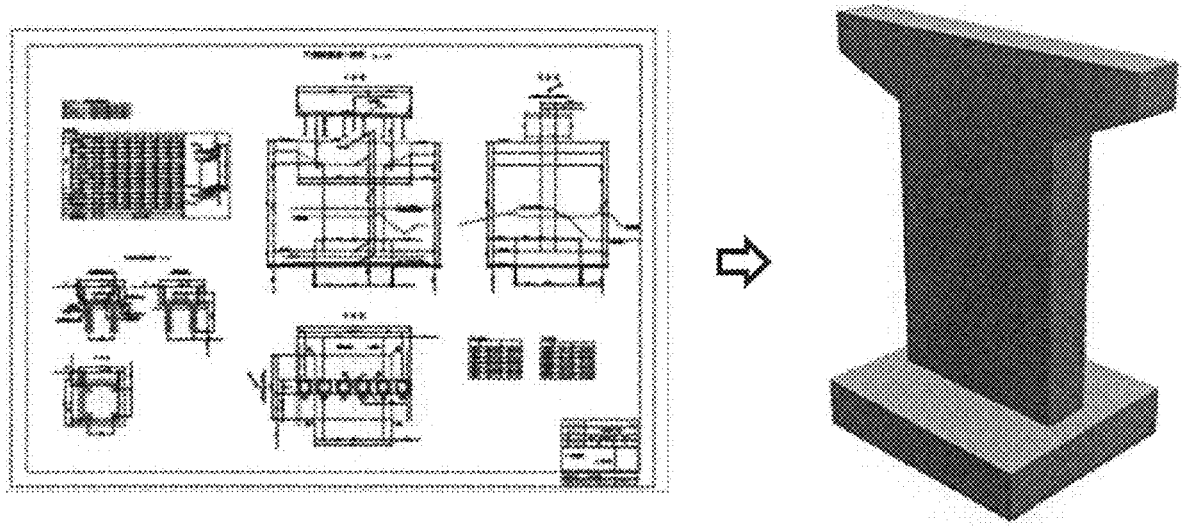
FIG. 20 is a drawing illustrating an automatic generation of a digital pier based on a two-dimensional CAD drawing.

In order to consider the digital bridge automatic generation technique according to the present disclosure, it is attempted to perform automatic interpretation and automatic generation of the representation target with respect to the drawing of two-dimensional CAD (DXF format), as the target, in which elements of the drawing such as line segments, character strings, and the like are recorded in a vector format. FIG. 20 illustrates an example in which a three-dimensional model of a pier is automatically established through such an attempt. A "pier front view", a "pier plan view", and a "pier side view" are interpreted as an interpretation result of the drawing. From the "pier front view", the "pier plan view", and the "pier side view", the projection plane of the building is automatically generated, and further, a three-dimensional model is automatically generated from the projection plane of the building. FIG. 12A is a drawing illustrating how a projection plane of a building is automatically generated from the front view, the plan view, and the side view. FIG. 12B is a drawing illustrating how a three-dimensional model is automatically generated from the projection plane of the building.

6. Other Embodiments

The first and second embodiments have been hereinabove explained as examples of techniques disclosed in the present application. However, the techniques according to the present disclosure are not limited thereto, and can be applied to embodiments to which changes, substitutions, additions, omissions, and the like are applied as necessary.

Also, the attached drawings and the detailed description have been provided to explain the embodiments. Therefore, the constituent elements described in the attached drawings and the detailed description include not only constituent elements essential for solving the problems but also constituent elements not essential for solving the problems in order to explain the above techniques. Therefore, the mere fact that those non-essential constituent elements are described in the attached drawings and the detailed description should not be understood as indicating that those non-essential constituent elements are mandatory.

In addition, the above-mentioned embodiments are for exemplifying the technology according to the present disclosure, and therefore, various changes, substitutions, additions, omissions, and the like can be made within the scope of claims or a range equivalent thereto.

The present application is based on priority application No. 2019-139150 filed in Japan on Jul. 29, 2019, the entire content of which is incorporated herein by reference.

REFERENCE SIGNS LIST

2 . . . data interpretation apparatus, 2' . . . data integration apparatus, 4 . . . control unit, 5 . . . platform, 5a . . . obtaining unit, 5b . . . interpretation unit, 5c . . . integration unit, 6 . . . RAM, 8 . . . ROM, 10 . . . bus, 12 . . . communication unit, 14 . . . input unit, 16 . . . output unit, 20 . . . external network, 24 . . . external server.

What is claimed is:

1. A data interpretation method executable by a data interpretation apparatus,
the data interpretation method using a platform configured to automatically execute type conversion of objects, the data interpretation method comprising:
obtaining input data as the objects of the platform,
generating an initial graph with respect to the objects, and
performing interpretation by automatically growing a graph from the initial graph by executing,
downcasting of one of the objects based on a hyponymy-and-hypernymy relationship between the objects, and adding, to the graph, a node associated with the one of the objects for which the downcasting has been executed, the downcasting being a type conversion to a hyponymy-side, and
upcasting of one of the objects based on the hyponymy-and-hypernymy relationship between the objects, and adding, to the graph, a node associated with the one of the objects for which the upcasting has been executed, the upcasting being a type conversion to a hypernymy-side, the downcasting and the upcasting being executed along a conversion path defined such that a meaning and a content of the one of the objects being downcast or upcast does not change.

2. A non-transitory computer-readable recording medium recorded with a data interpretation program that causes the data interpretation apparatus to execute the data interpretation method of claim 1.

3. A data interpretation apparatus comprising a processor and a memory storing programs instructions that cause the processor to perform the data interpretation method of claim 1.

4. A data integration method executable by a data integration apparatus, the data integration method using a platform configured to automatically execute type conversion of objects, the data integration method comprising:
obtaining input data as the objects of the platform;
generating an initial graph with respect to the objects,
performing interpretation by automatically growing a graph from the initial graph by executing,
downcasting of one of the objects based on a hyponymy-and-hypernymy relationship between the objects, and adding, to the graph, a node associated with the one of the objects for which the downcasting has been executed, the downcasting being a type conversion to a hyponymy-side, and
upcasting of one of the objects based on the hyponymy-and-hypernymy relationship between the objects, and adding, to the graph, a node associated with the one of the objects for which the upcasting has been executed, the upcasting being a type conversion to a hypernymy-side, the downcasting and the upcasting being executed along a conversion path defined such that a meaning and a content of the one of the objects being downcast or upcast does not change, and
establishing integrated data by integrating information extracted from the interpretation results.

5. A non-transitory computer-readable recording medium recorded with a data integration program that causes the data integration apparatus to execute the data integration method of claim 4.

6. A data integration apparatus comprising a processor and a memory storing programs instructions that cause the processor to perform the data integration method of claim 4.

7. A digital city establishing system comprising a platform configured to perform automatic conversion of type conversion of objects and a plurality of programs, data input to the plurality of programs being in different formats for each of the plurality of programs, wherein the platform is configured to:
  obtaining the input data as the objects of the platform,
  abstracting the formats of data input to the plurality of programs through pathfinding and the automatic execution of the type conversion, thereby making a scope of application of the plurality of programs independent of the formats of data and achieving flexible change of connection between the plurality of programs and the data in different formats, wherein the pathfinding and the automatic execution of the type conversion type conversion includes:
  downcasting of one of the objects based on a hyponymy-and-hypernymy relationship between the objects, the downcasting being a type conversion to a hyponymy-side, and
  upcasting of one of the objects based on the hyponymy-and-hypernymy relationship between the objects, the upcasting being a type conversion to a hypernymy-side, the downcasting and the upcasting being executed along a conversion path defined such that a meaning and a content of the one of the objects being downcast or upcast does not change.

* * * * *